United States Patent
Tong et al.

(10) Patent No.: US 9,275,979 B2
(45) Date of Patent: Mar. 1, 2016

(54) ENHANCED COLOR RENDERING INDEX EMITTER THROUGH PHOSPHOR SEPARATION

(75) Inventors: Tao Tong, Oxnard, CA (US); Ronan LeToquin, Fremont, CA (US); Bernd Keller, Santa Barbara, CA (US); James Ibbetson, Santa Barbara, CA (US); Gerald Negley, Durham, NC (US)

(73) Assignee: CREE, INC., Durham, NC (US)

( * ) Notice: Subject to any disclaimer, the term of this patent is extended or adjusted under 35 U.S.C. 154(b) by 436 days.

(21) Appl. No.: 13/028,863

(22) Filed: Feb. 16, 2011

(65) Prior Publication Data

US 2011/0228514 A1  Sep. 22, 2011

Related U.S. Application Data

(63) Continuation-in-part of application No. 12/848,825, filed on Aug. 2, 2010, now Pat. No. 8,562,161, and a continuation-in-part of application No. 12/889,719, filed on Sep. 24, 2010, and a continuation-in-part of (Continued)

(51) Int. Cl.
 *F21V 9/16* (2006.01)
 *H01L 25/075* (2006.01)
 (Continued)

(52) U.S. Cl.
 CPC ............ *H01L 25/0753* (2013.01); *F21K 9/135* (2013.01); *F21K 9/56* (2013.01);
 (Continued)

(58) Field of Classification Search
 CPC .............. G02F 1/133603; G02F 2001/133614; F21V 9/16; F21Y 2101/02; F21Y 2113/005; H01L 33/50

USPC ................................ 313/498–512; 257/40, 98
See application file for complete search history.

(56) References Cited

U.S. PATENT DOCUMENTS

| 2,394,992 A | 2/1946 | Franck ..................... 362/311.12 |
| 3,143,592 A | 8/1964 | August ........................ 174/16.3 |

(Continued)

FOREIGN PATENT DOCUMENTS

| CN | 1425117 | 6/2003 |
| CN | 1465106 A | 12/2003 |

(Continued)

OTHER PUBLICATIONS

Search Report and Written Opinion from PCT Application No. PCT/US2012/072108, dated Feb. 27, 2013.

(Continued)

*Primary Examiner* — Tracie Y Green
(74) *Attorney, Agent, or Firm* — Koppel, Patrick, Heybl & Philpott

(57) ABSTRACT

LED packages, and LED lamps and bulbs, are disclosed that are arranged to minimize the CRI and efficiency losses resulting from the overlap of conversion material emission and excitation spectrum. In different devices having conversion materials with this overlap, the present invention arranges the conversion materials to reduce the likelihood that re-emitted light from a first conversion materials will encounter the second conversion material to minimize the risk of re-absorption. In some embodiments this risk is minimized by different arrangements where there is separation between the two phosphors. In some embodiments this separation results less than 50% of re-emitted light from the one phosphor passing into the phosphor where it risks re-absorption.

52 Claims, 9 Drawing Sheets

Related U.S. Application Data application No. 12/975,820, filed on Dec. 22, 2010, now Pat. No. 9,052,067.

(60) Provisional application No. 61/339,516, filed on Mar. 3, 2010, provisional application No. 61/339,515, filed on Mar. 3, 2010, provisional application No. 61/386,437, filed on Sep. 24, 2010, provisional application No. 61/424,665, filed on Dec. 19, 2010, provisional application No. 61/424,670, filed on Dec. 19, 2010, provisional application No. 61/434,355, filed on Jan. 19, 2011, provisional application No. 61/435,326, filed on Jan. 23, 2011, provisional application No. 61/435,759, filed on Jan. 24, 2011.

(51) Int. Cl.
*H01L 33/50* (2010.01)
*F21K 99/00* (2010.01)
*F21V 3/02* (2006.01)
*F21V 3/04* (2006.01)
*H01L 33/54* (2010.01)
*H01L 33/60* (2010.01)
*F21Y 101/02* (2006.01)
*F21Y 113/00* (2006.01)

(52) U.S. Cl.
CPC ............... *F21V 3/02* (2013.01); *F21V 3/0481* (2013.01); *H01L 33/504* (2013.01); *H01L 33/507* (2013.01); *H01L 33/54* (2013.01); *H01L 33/60* (2013.01); *F21Y 2101/02* (2013.01); *F21Y 2113/005* (2013.01); *H01L 2224/32245* (2013.01); *H01L 2224/48091* (2013.01); *H01L 2224/73265* (2013.01)

(56) References Cited

U.S. PATENT DOCUMENTS

| | | |
|---|---|---|
| 3,581,162 A | 5/1971 | Wheatley |
| 3,805,937 A | 4/1974 | Hatanaka et al. |
| 3,875,456 A | 4/1975 | Kano et al. |
| 3,927,290 A | 12/1975 | Denley |
| 4,120,026 A | 10/1978 | Tsuchihashi et al. |
| 4,204,246 A | 5/1980 | Arii et al. ............... 361/699 |
| 4,325,146 A | 4/1982 | Lennington |
| 4,408,157 A | 10/1983 | Beaubien |
| 4,420,398 A | 12/1983 | Castino |
| 4,710,699 A | 12/1987 | Miyamoto |
| 4,772,885 A | 9/1988 | Uehara et al. |
| 4,918,497 A | 4/1990 | Edmond ............... 357/17 |
| 4,966,862 A | 10/1990 | Edmond ............... 437/100 |
| 5,027,168 A | 6/1991 | Edmond ............... 357/17 |
| 5,087,883 A | 2/1992 | Hoffman |
| 5,166,815 A | 11/1992 | Elderfield |
| 5,210,051 A | 5/1993 | Carter, Jr. ............... 437/107 |
| 5,264,997 A | 11/1993 | Hutchinsson et al. |
| 5,338,944 A | 8/1994 | Edmond et al. ............... 257/76 |
| 5,393,993 A | 2/1995 | Edmond et al. ............... 257/77 |
| 5,407,799 A | 4/1995 | Studier |
| 5,410,519 A | 4/1995 | Hall et al. |
| 5,416,342 A | 5/1995 | Edmond et al. ............... 257/76 |
| 5,463,280 A | 10/1995 | Johnson |
| 5,477,436 A | 12/1995 | Betling et al. |
| 5,523,589 A | 6/1996 | Edmond et al. ............... 257/77 |
| 5,535,230 A | 7/1996 | Abe |
| 5,561,346 A | 10/1996 | Byrne |
| 5,563,849 A | 10/1996 | Hall et al. |
| 5,581,683 A | 12/1996 | Bertignoll et al. |
| 5,585,783 A | 12/1996 | Hall |
| 5,604,135 A | 2/1997 | Edmond et al. ............... 437/22 |
| 5,631,190 A | 5/1997 | Negley ............... 438/33 |
| 5,655,830 A | 8/1997 | Ruskouski |
| 5,688,042 A | 11/1997 | Madadi et al. |
| 5,739,554 A | 4/1998 | Edmond et al. ............... 257/103 |
| 5,779,924 A | 7/1998 | Krames et al. ............... 216/64 |
| 5,803,579 A | 9/1998 | Turnbull et al. |
| 5,806,965 A | 9/1998 | Deese |
| 5,838,101 A | 11/1998 | Pappalardo ............... 313/487 |
| 5,851,063 A | 12/1998 | Doughty et al. |
| 5,890,794 A | 4/1999 | Abtahi et al. |
| 5,912,477 A | 6/1999 | Negley ............... 257/95 |
| 5,934,798 A | 8/1999 | Roller et al. ............... 362/497 |
| 5,947,588 A | 9/1999 | Huang |
| 5,949,347 A | 9/1999 | Wu |
| 5,959,316 A | 9/1999 | Lowery |
| 6,043,509 A | 3/2000 | Kurihara et al. |
| 6,066,861 A | 5/2000 | Hohn et al. |
| 6,071,795 A | 6/2000 | Cheung et al. ............... 438/458 |
| 6,076,936 A | 6/2000 | George |
| 6,084,250 A | 7/2000 | Justel et al. |
| 6,095,666 A | 8/2000 | Salam |
| 6,120,600 A | 9/2000 | Edmond et al. ............... 117/89 |
| 6,132,072 A | 10/2000 | Turnbull et al. |
| 6,144,429 A | 11/2000 | Nakai et al. |
| 6,187,606 B1 | 2/2001 | Edmond et al. ............... 438/46 |
| 6,201,262 B1 | 3/2001 | Edmond et al. ............... 257/77 |
| 6,212,213 B1 | 4/2001 | Weber et al. |
| 6,218,785 B1 | 4/2001 | Incerti |
| 6,220,722 B1 | 4/2001 | Begemann |
| 6,220,731 B1 | 4/2001 | Ryan ............... 362/373 |
| 6,227,679 B1 | 5/2001 | Zhang et al. |
| 6,234,648 B1 | 5/2001 | Borner et al. |
| 6,250,774 B1 | 6/2001 | Begemann et al. |
| 6,252,254 B1 | 6/2001 | Soules et al. |
| 6,255,670 B1 | 7/2001 | Srivastava et al. |
| 6,270,722 B1 | 8/2001 | Yang et al. ............... 422/37 |
| 6,276,822 B1 | 8/2001 | Bedrosian et al. |
| 6,278,135 B1 | 8/2001 | Srivastava et al. |
| 6,292,901 B1 | 9/2001 | Lys et al. |
| 6,294,800 B1 | 9/2001 | Duggal et al. |
| 6,319,425 B1 | 11/2001 | Tasaki et al. |
| 6,329,676 B1 | 12/2001 | Takayama et al. |
| 6,335,538 B1 | 1/2002 | Prutchi et al. |
| 6,337,536 B1 | 1/2002 | Matsubara et al. |
| 6,348,766 B1 | 2/2002 | Ohishi et al. |
| 6,350,041 B1 | 2/2002 | Tarsa et al. |
| 6,357,889 B1 | 3/2002 | Duggal et al. |
| 6,373,188 B1 | 4/2002 | Johnson et al. |
| 6,394,621 B1 | 5/2002 | Hanewinkel |
| 6,404,131 B1 | 6/2002 | Kawano et al. ............... 315/82 |
| 6,420,199 B1 | 7/2002 | Coman et al. ............... 438/22 |
| 6,429,583 B1 | 8/2002 | Levinson et al. |
| 6,441,558 B1 | 8/2002 | Muthu |
| 6,465,961 B1 | 10/2002 | Cao |
| 6,480,299 B1 | 11/2002 | Drakopoulos et al. |
| 6,501,100 B1 | 12/2002 | Srivastava et al. |
| 6,504,179 B1 | 1/2003 | Ellens et al. |
| 6,504,180 B1 | 1/2003 | Heremans et al. ............... 257/98 |
| 6,513,949 B1 | 2/2003 | Marshall et al. |
| 6,517,221 B1 | 2/2003 | Xie ............... 362/373 |
| 6,522,065 B1 | 2/2003 | Srivastava et al. |
| 6,523,978 B1 | 2/2003 | Huang |
| 6,538,371 B1 | 3/2003 | Duggal et al. |
| 6,547,249 B2 | 4/2003 | Collins, III et al. |
| 6,550,949 B1 | 4/2003 | Bauer et al. |
| 6,550,953 B1 | 4/2003 | Ichikawa et al. |
| 6,552,495 B1 | 4/2003 | Chang |
| 6,559,075 B1 | 5/2003 | Kelley et al. ............... 438/795 |
| 6,577,073 B2 | 6/2003 | Shimizu et al. |
| 6,578,986 B2 | 6/2003 | Swaris et al. |
| 6,592,810 B2 | 7/2003 | Nishida et al. |
| 6,600,175 B1 | 7/2003 | Baretz et al. |
| 6,600,324 B2 | 7/2003 | St-Germain |
| 6,603,258 B1 | 8/2003 | Meuller-Mach et al. |
| 6,608,485 B2 | 8/2003 | St-Germain |
| 6,616,862 B2 | 9/2003 | Srivastava et al. |
| 6,624,350 B2 | 9/2003 | Nixon et al. |
| 6,634,770 B2 | 10/2003 | Cao |
| 6,635,503 B2 | 10/2003 | Andrews et al. |
| 6,636,003 B2 | 10/2003 | Rahm et al. |
| 6,642,666 B1 | 11/2003 | St-Germain |
| 6,657,236 B1 | 12/2003 | Thibeault et al. ............... 257/98 |

(56) References Cited

U.S. PATENT DOCUMENTS

| | | |
|---|---|---|
| 6,659,632 B2 | 12/2003 | Chen |
| 6,685,852 B2 | 2/2004 | Setlur et al. |
| 6,686,691 B1 | 2/2004 | Mueller et al. |
| 6,692,136 B2 | 2/2004 | Marshall et al. |
| 6,703,173 B2 | 3/2004 | Lu et al. |
| 6,709,132 B2 | 3/2004 | Ishibashi |
| 6,712,486 B1 | 3/2004 | Popovich et al. |
| 6,737,801 B2 | 5/2004 | Ragle |
| 6,744,194 B2 | 6/2004 | Fukasawa et al. |
| 6,746,885 B2 | 6/2004 | Cao ............................... 438/26 |
| 6,762,563 B2 | 7/2004 | St-Germain |
| 6,764,202 B1 | 7/2004 | Herring et al. ................ 362/371 |
| 6,784,463 B2 | 8/2004 | Camras et al. |
| 6,791,257 B1 | 9/2004 | Sato et al. |
| 6,800,500 B2 | 10/2004 | Coman et al. .................. 438/22 |
| 6,803,607 B1 | 10/2004 | Chan et al. |
| 6,809,347 B2 | 10/2004 | Tasch et al. |
| 6,817,735 B2 | 11/2004 | Shimizu et al. |
| 6,841,804 B1 | 1/2005 | Chen et al. |
| 6,848,819 B1 | 2/2005 | Arndt et al. |
| 6,851,834 B2 | 2/2005 | Leysath |
| 6,860,620 B2 | 3/2005 | Kuan et al. ..................... 362/294 |
| 6,864,513 B2 | 3/2005 | Lin et al. |
| 6,880,954 B2 | 4/2005 | Ollett et al. |
| 6,882,101 B2 | 4/2005 | Ragle |
| 6,885,035 B2 | 4/2005 | Bhat et al. |
| 6,910,794 B2 | 6/2005 | Rice ................................ 362/547 |
| 6,914,267 B2 | 7/2005 | Fukasawa et al. |
| 6,936,857 B2 | 8/2005 | Doxsee et al. |
| 6,943,380 B2 | 9/2005 | Ota et al. |
| 6,948,829 B2 | 9/2005 | Verdes et al. |
| 6,957,899 B2 | 10/2005 | Jiang et al. |
| 6,967,116 B2 | 11/2005 | Negley |
| 6,980,176 B2 | 12/2005 | Matsumoto et al. |
| 6,982,518 B2 | 1/2006 | Chou et al. |
| 6,997,580 B2 | 2/2006 | Wong ........................ 362/311.02 |
| 7,005,679 B2 | 2/2006 | Tarsa et al. |
| 7,008,078 B2 | 3/2006 | Shimizu et al. |
| 7,009,199 B2 | 3/2006 | Hall |
| 7,009,343 B2 | 3/2006 | Lim et al. |
| 7,014,336 B1 | 3/2006 | Ducharme et al. |
| 7,023,019 B2 | 4/2006 | Maeda et al. |
| 7,029,935 B2 | 4/2006 | Negley et al. |
| 7,048,412 B2 | 5/2006 | Martin et al. |
| 7,061,454 B2 | 6/2006 | Sasuga et al. |
| 7,066,623 B2 | 6/2006 | Lee et al. |
| 7,080,924 B2 | 7/2006 | Tseng et al. |
| 7,083,302 B2 | 8/2006 | Chen et al. |
| 7,086,756 B2 | 8/2006 | Maxik |
| 7,086,767 B2 | 8/2006 | Sidwell et al. |
| 7,093,958 B2 | 8/2006 | Coushaine |
| 7,094,362 B2 | 8/2006 | Setlur et al. .................... 252/301 |
| 7,095,056 B2 | 8/2006 | Vitta |
| 7,102,172 B2 | 9/2006 | Lynch et al. |
| 7,116,308 B1 | 10/2006 | Heeks et al. |
| 7,118,262 B2 | 10/2006 | Negley et al. |
| 7,125,143 B2 | 10/2006 | Hacker |
| 7,135,664 B2 | 11/2006 | Vornsand et al. |
| 7,140,753 B2 | 11/2006 | Wang et al. ..................... 362/294 |
| 7,144,135 B2 | 12/2006 | Martin et al. |
| 7,160,012 B2 | 1/2007 | Hilscher et al. |
| 7,160,120 B2 | 1/2007 | Zhang et al. |
| 7,164,231 B2 | 1/2007 | Choi et al. |
| 7,165,866 B2 | 1/2007 | Li |
| 7,172,314 B2 | 2/2007 | Currie et al. |
| 7,195,944 B2 | 3/2007 | Tran et al. |
| 7,207,691 B2 | 4/2007 | Lee et al. |
| 7,213,940 B1 | 5/2007 | Van De Ven et al. ............ 257/89 |
| 7,213,942 B2 | 5/2007 | Jiang et al. |
| 7,215,074 B2 | 5/2007 | Shimizu et al. |
| 7,221,044 B2 | 5/2007 | Fan et al. |
| 7,232,212 B2 | 6/2007 | Iwase |
| D546,980 S | 7/2007 | Lo |
| 7,239,085 B2 | 7/2007 | Kawamura |
| 7,250,715 B2 | 7/2007 | Mueller et al. |
| 7,255,457 B2 | 8/2007 | Ducharme et al. |
| 7,256,557 B2 | 8/2007 | Lim et al. |
| 7,268,370 B2 | 9/2007 | Ueda |
| 7,270,446 B2 | 9/2007 | Chang et al. .................... 362/294 |
| D553,267 S | 10/2007 | Yuen |
| 7,322,732 B2 | 1/2008 | Negley et al. |
| 7,329,024 B2 | 2/2008 | Lynch et al. |
| 1,047,824 A1 | 4/2008 | Le Toquin |
| 7,350,936 B2 | 4/2008 | Ducharme et al. ............ 362/231 |
| 7,354,174 B1 | 4/2008 | Yan |
| 7,358,954 B2 | 4/2008 | Negley |
| 7,365,485 B2 | 4/2008 | Fukasawa et al. |
| 7,377,674 B2 | 5/2008 | Klinkman et al. ............ 362/484 |
| 7,387,405 B2 | 6/2008 | Ducharme et al. |
| 7,396,142 B2 | 7/2008 | Laizure, Jr. et al. |
| 7,405,857 B2 | 7/2008 | Ma et al. |
| 7,413,325 B2 | 8/2008 | Chen ........................ 362/249.01 |
| 7,420,221 B2 | 9/2008 | Nagai |
| 7,422,504 B2 | 9/2008 | Maeda et al. |
| D581,556 S | 11/2008 | To et al. ........................... D26/2 |
| 7,453,195 B2 | 11/2008 | Radkov |
| 7,474,044 B2 | 1/2009 | Ge |
| 7,547,124 B2 | 6/2009 | Chang et al. .................... 362/373 |
| 7,549,782 B2 | 6/2009 | Ng et al. .......................... 362/555 |
| 7,600,882 B1 | 10/2009 | Morejon et al. |
| 7,607,802 B2 | 10/2009 | Kang et al. ...................... 362/294 |
| 7,614,759 B2 | 11/2009 | Negley |
| 7,618,157 B1 | 11/2009 | Galvez |
| 7,663,315 B1 | 2/2010 | Hulse |
| 7,686,478 B1 | 3/2010 | Hulse |
| 7,710,016 B2 | 5/2010 | Miki et al. ....................... 257/98 |
| 7,726,836 B2 | 6/2010 | Chen |
| 7,740,365 B2 | 6/2010 | Huttner et al. ................... 362/97 |
| 7,753,568 B2 | 7/2010 | Hu et al. ......................... 362/373 |
| 7,810,954 B2 | 10/2010 | Kolodin ........................... 362/277 |
| 7,824,065 B2 | 11/2010 | Maxik |
| D629,928 S | 12/2010 | Chen et al. |
| 7,884,538 B2 | 2/2011 | Mitsuishi et al. .............. 313/502 |
| 7,976,335 B2 | 7/2011 | Weber et al. ................... 439/487 |
| 7,989,236 B2 | 8/2011 | Yamaguchi et al. ............. 438/26 |
| 8,021,025 B2 | 9/2011 | Lee |
| 8,235,571 B2 | 8/2012 | Park ................................. 362/555 |
| 8,253,316 B2 | 8/2012 | Sun et al. |
| 8,272,762 B2 | 9/2012 | Maxik et al. |
| 8,274,241 B2 | 9/2012 | Guest et al. |
| 8,277,082 B2 | 10/2012 | Dassanayake et al. |
| 8,282,250 B1 | 10/2012 | Dassanayake et al. |
| 8,292,468 B2 | 10/2012 | Narendran et al. |
| 8,309,969 B2 | 11/2012 | Suehiro et al. .................... 257/79 |
| 8,314,537 B2 | 11/2012 | Gielen et al. ..................... 313/46 |
| 8,322,896 B2 | 12/2012 | Falicoff et al. |
| 8,348,470 B2 | 1/2013 | Liu et al. ......................... 362/294 |
| 8,371,722 B2 | 2/2013 | Carroll |
| 8,400,051 B2 | 3/2013 | Hakata et al. |
| 8,410,512 B2 | 4/2013 | Andrews .......................... 257/99 |
| 8,415,865 B2 | 4/2013 | Liang et al. |
| 8,421,320 B2 | 4/2013 | Chuang |
| 8,421,321 B2 | 4/2013 | Chuang |
| 8,421,322 B2 | 4/2013 | Carroll et al. |
| 8,449,154 B2 | 5/2013 | Uemoto et al. |
| 8,502,468 B2 | 8/2013 | Li et al. |
| 8,568,009 B2 | 10/2013 | Chiang et al. .................. 362/563 |
| 8,641,237 B2 | 2/2014 | Chuang |
| 8,653,723 B2 | 2/2014 | Cao et al. |
| 8,696,168 B2 | 4/2014 | Li et al. |
| 8,740,415 B2 | 6/2014 | Wheelock |
| 8,750,671 B1 | 6/2014 | Kelly et al. |
| 8,752,984 B2 | 6/2014 | Lenk et al. |
| 8,760,042 B2 | 6/2014 | Sakai et al. |
| 8,922,106 B2 | 12/2014 | Helbing et al. .......... 313/318.11 |
| 2001/0002049 A1 | 5/2001 | Reeh et al. |
| 2002/0006044 A1 | 1/2002 | Harbers et al. |
| 2002/0015013 A1 | 2/2002 | Ragle |
| 2002/0047516 A1 | 4/2002 | Iwasa et al. ..................... 313/512 |
| 2002/0068201 A1 | 6/2002 | Vaudo et al. .................... 428/704 |
| 2002/0070681 A1 | 6/2002 | Shimizu et al. |
| 2002/0087532 A1 | 7/2002 | Barritz et al. |
| 2002/0114169 A1 | 8/2002 | Harada et al. ................... 362/558 |
| 2002/0123164 A1 | 9/2002 | Slater, Jr. et al. ............... 438/39 |

(56) References Cited

U.S. PATENT DOCUMENTS

| | | |
|---|---|---|
| 2002/0149576 A1 | 10/2002 | Tanaka et al. |
| 2003/0006418 A1 | 1/2003 | Emerson et al. ............... 257/79 |
| 2003/0021113 A1 | 1/2003 | Begemann |
| 2003/0026096 A1 | 2/2003 | Ellens et al. |
| 2003/0030063 A1 | 2/2003 | Sosniak et al. |
| 2003/0038291 A1 | 2/2003 | Cao |
| 2003/0042908 A1 | 3/2003 | St-Germain |
| 2003/0042914 A1 | 3/2003 | St-Germain |
| 2003/0067302 A1 | 4/2003 | St-Germain |
| 2003/0067773 A1 | 4/2003 | Marshall et al. |
| 2003/0081419 A1 | 5/2003 | Jacob et al. ................... 362/364 |
| 2003/0089918 A1 | 5/2003 | Hiller et al. |
| 2003/0146411 A1 | 8/2003 | Srivastava et al. |
| 2003/0185005 A1 | 10/2003 | Sommers et al. |
| 2003/0209997 A1 | 11/2003 | St-Germain et al. |
| 2003/0222268 A1 | 12/2003 | Yocom et al. |
| 2004/0021629 A1 | 2/2004 | Sasuga et al. |
| 2004/0046178 A1 | 3/2004 | Sano |
| 2004/0056260 A1 | 3/2004 | Slater, Jr. et al. ............. 257/79 |
| 2004/0105264 A1 | 6/2004 | Spero |
| 2004/0159846 A1 | 8/2004 | Doxsee |
| 2004/0201990 A1 | 10/2004 | Neyer |
| 2004/0212998 A1 | 10/2004 | Mohacsi |
| 2004/0218387 A1 | 11/2004 | Gerlach |
| 2004/0218388 A1 | 11/2004 | Suzuki |
| 2004/0222735 A1 | 11/2004 | Ragle |
| 2004/0223315 A1 | 11/2004 | Suehiro et al. ................. 362/84 |
| 2004/0239839 A1 | 12/2004 | Hong |
| 2004/0264193 A1 | 12/2004 | Okumura |
| 2004/0264212 A1 | 12/2004 | Chung et al. |
| 2005/0006659 A1 | 1/2005 | Ng et al. |
| 2005/0007306 A1 | 1/2005 | Iisaka et al. |
| 2005/0052378 A1 | 3/2005 | Hacker |
| 2005/0068776 A1 | 3/2005 | Ge ............................... 362/296.08 |
| 2005/0093004 A1 | 5/2005 | Yoo |
| 2005/0133808 A1 | 6/2005 | Uraya et al. |
| 2005/0151138 A1 | 7/2005 | Slater, Jr. et al. ............. 257/79 |
| 2005/0168990 A1 | 8/2005 | Nagata et al. ................. 362/294 |
| 2005/0174780 A1 | 8/2005 | Park ............................... 362/294 |
| 2005/0184638 A1* | 8/2005 | Mueller et al. ................. 313/485 |
| 2005/0190141 A1 | 9/2005 | Roth et al. |
| 2005/0215000 A1 | 9/2005 | Negley ............................ 438/200 |
| 2005/0219060 A1 | 10/2005 | Curran et al. ............. 340/815.45 |
| 2005/0225988 A1 | 10/2005 | Chaves et al. |
| 2005/0227379 A1 | 10/2005 | Donofrio ............................ 438/4 |
| 2005/0231976 A1 | 10/2005 | Keuper et al. |
| 2005/0242711 A1 | 11/2005 | Bloomfield |
| 2005/0243556 A1 | 11/2005 | Lynch |
| 2005/0251698 A1 | 11/2005 | Lynch et al. |
| 2005/0253151 A1 | 11/2005 | Sakai et al. |
| 2005/0259423 A1 | 11/2005 | Heuser |
| 2005/0274972 A1 | 12/2005 | Roth et al. |
| 2005/0276053 A1 | 12/2005 | Nortrup et al. ................. 362/294 |
| 2006/0012989 A1 | 1/2006 | Lee |
| 2006/0022582 A1 | 2/2006 | Radkov |
| 2006/0060872 A1 | 3/2006 | Edmond et al. |
| 2006/0061259 A1 | 3/2006 | Negley ............................ 313/499 |
| 2006/0063289 A1 | 3/2006 | Negley et al. ..................... 438/26 |
| 2006/0067073 A1 | 3/2006 | Ting |
| 2006/0090790 A1 | 5/2006 | Kobayashi et al. |
| 2006/0097245 A1 | 5/2006 | Aanegola et al. ............... 257/26 |
| 2006/0097385 A1 | 5/2006 | Negley ............................ 257/722 |
| 2006/0105482 A1 | 5/2006 | Alferink |
| 2006/0105485 A1 | 5/2006 | Basin et al. |
| 2006/0113548 A1 | 6/2006 | Chen et al. |
| 2006/0115482 A1 | 6/2006 | Sauer et al. ........................ 438/22 |
| 2006/0124953 A1 | 6/2006 | Negley et al. |
| 2006/0138435 A1 | 6/2006 | Tarsa et al. |
| 2006/0138937 A1 | 6/2006 | Ibbetson |
| 2006/0152140 A1 | 7/2006 | Brandes |
| 2006/0152172 A9 | 7/2006 | Mueller et al. |
| 2006/0152820 A1 | 7/2006 | Lien et al. ....................... 359/726 |
| 2006/0180774 A1 | 8/2006 | Endo ............................ 250/485.1 |
| 2006/0180818 A1 | 8/2006 | Nagai |
| 2006/0181192 A1 | 8/2006 | Radkov |
| 2006/0202105 A1 | 9/2006 | Krames et al. |
| 2006/0226759 A1 | 10/2006 | Masuda et al. |
| 2006/0227558 A1 | 10/2006 | Osawa et al. ................... 362/351 |
| 2006/0245184 A1 | 11/2006 | Galli |
| 2007/0001188 A1 | 1/2007 | Lee |
| 2007/0001994 A1 | 1/2007 | Roth |
| 2007/0041220 A1 | 2/2007 | Lynch |
| 2007/0047232 A1 | 3/2007 | Kim et al. |
| 2007/0051966 A1 | 3/2007 | Higashi |
| 2007/0069663 A1 | 3/2007 | Burdalski et al. |
| 2007/0090381 A1 | 4/2007 | Otsuka et al. |
| 2007/0090737 A1 | 4/2007 | Hu et al. ........................... 313/11 |
| 2007/0091633 A1 | 4/2007 | Harrity et al. |
| 2007/0137074 A1 | 6/2007 | Van De Ven et al. |
| 2007/0139920 A1 | 6/2007 | Van De Ven et al. |
| 2007/0139923 A1 | 6/2007 | Negley et al. |
| 2007/0139938 A1 | 6/2007 | Petroski |
| 2007/0139949 A1 | 6/2007 | Tanda et al. ................... 362/551 |
| 2007/0158668 A1 | 7/2007 | Tarsa et al. ....................... 257/98 |
| 2007/0170447 A1 | 7/2007 | Negley |
| 2007/0171145 A1 | 7/2007 | Coleman et al. |
| 2007/0182299 A1 | 8/2007 | Ouderkirk et al. ............ 313/110 |
| 2007/0202623 A1 | 8/2007 | Gao |
| 2007/0206375 A1 | 9/2007 | Lys |
| 2007/0210326 A1 | 9/2007 | Kurihara |
| 2007/0215890 A1 | 9/2007 | Harbers et al. |
| 2007/0223219 A1 | 9/2007 | Medendorp et al. |
| 2007/0236911 A1 | 10/2007 | Negley |
| 2007/0247414 A1 | 10/2007 | Robert |
| 2007/0247847 A1 | 10/2007 | Villard |
| 2007/0262337 A1 | 11/2007 | Villard |
| 2007/0263393 A1 | 11/2007 | Van De Ven |
| 2007/0263405 A1 | 11/2007 | Ng et al. ......................... 362/555 |
| 2007/0267976 A1 | 11/2007 | Bohler et al. ................... 315/112 |
| 2007/0267983 A1 | 11/2007 | Van De Ven et al. |
| 2007/0274063 A1 | 11/2007 | Negley |
| 2007/0274080 A1* | 11/2007 | Negley et al. .................. 362/341 |
| 2007/0276606 A1 | 11/2007 | Radkov |
| 2007/0278503 A1 | 12/2007 | Van De Ven et al. |
| 2007/0278934 A1 | 12/2007 | Van De Ven et al. |
| 2007/0278974 A1 | 12/2007 | Van De Ven |
| 2007/0279440 A1 | 12/2007 | Negley |
| 2007/0279903 A1 | 12/2007 | Negley et al. |
| 2007/0280624 A1 | 12/2007 | Negley et al. |
| 2007/0285924 A1 | 12/2007 | Morris et al. ................... 362/264 |
| 2007/0297179 A1 | 12/2007 | Leung et al. |
| 2007/0297183 A1 | 12/2007 | Coushaine |
| 2008/0037257 A1 | 2/2008 | Bolta |
| 2008/0055908 A1 | 3/2008 | Wu et al. ........................ 362/294 |
| 2008/0062694 A1 | 3/2008 | Lai et al. ........................ 362/294 |
| 2008/0074032 A1 | 3/2008 | Yano et al. |
| 2008/0080165 A1 | 4/2008 | Kim et al. |
| 2008/0084685 A1 | 4/2008 | Van De Ven et al. |
| 2008/0084700 A1 | 4/2008 | Van De Ven |
| 2008/0084701 A1 | 4/2008 | Van De Ven et al. |
| 2008/0088248 A1 | 4/2008 | Myers |
| 2008/0089053 A1 | 4/2008 | Negley |
| 2008/0093615 A1 | 4/2008 | Lin et al. |
| 2008/0106893 A1 | 5/2008 | Johnson et al. |
| 2008/0106895 A1 | 5/2008 | Van de Ven et al. |
| 2008/0106907 A1 | 5/2008 | Trott et al. |
| 2008/0112168 A1 | 5/2008 | Pickard et al. |
| 2008/0112170 A1 | 5/2008 | Trott et al. |
| 2008/0112183 A1 | 5/2008 | Negley |
| 2008/0117620 A1 | 5/2008 | Hama et al. ....................... 362/84 |
| 2008/0128735 A1 | 6/2008 | Yoo et al. |
| 2008/0130265 A1 | 6/2008 | Negley et al. |
| 2008/0130285 A1 | 6/2008 | Negley |
| 2008/0136313 A1 | 6/2008 | Negley |
| 2008/0137347 A1 | 6/2008 | Trott et al. |
| 2008/0149166 A1 | 6/2008 | Beeson et al. ................... 136/248 |
| 2008/0170396 A1 | 7/2008 | Yuan et al. |
| 2008/0173884 A1 | 7/2008 | Chitnis et al. ..................... 257/98 |
| 2008/0179602 A1 | 7/2008 | Negley |
| 2008/0179611 A1 | 7/2008 | Chitnis et al. ..................... 257/98 |
| 2008/0192462 A1 | 8/2008 | Steedly et al. |
| 2008/0192493 A1 | 8/2008 | Villard |
| 2008/0198572 A1 | 8/2008 | Medendorp |
| 2008/0211416 A1 | 9/2008 | Negley et al. |

(56) References Cited

U.S. PATENT DOCUMENTS

| | | | |
|---|---|---|---|
| 2008/0231201 A1 | 9/2008 | Higley et al. | |
| 2008/0232119 A1 | 9/2008 | Ribarich | 362/373 |
| 2008/0259589 A1 | 10/2008 | Van De Ven | |
| 2008/0278928 A1 | 11/2008 | Van De Ven et al. | |
| 2008/0278940 A1 | 11/2008 | Van De Ven et al. | |
| 2008/0278950 A1 | 11/2008 | Pickard et al. | |
| 2008/0278952 A1 | 11/2008 | Trott et al. | |
| 2008/0285279 A1 | 11/2008 | Ng et al. | 362/249 |
| 2008/0304250 A1 | 12/2008 | Harbers et al. | |
| 2008/0304260 A1 | 12/2008 | Van De Ven et al. | |
| 2008/0304261 A1 | 12/2008 | Van De Ven et al. | |
| 2008/0304269 A1 | 12/2008 | Pickard et al. | |
| 2008/0308825 A1 | 12/2008 | Chakraborty et al. | 257/98 |
| 2008/0309255 A1 | 12/2008 | Myers | |
| 2008/0310154 A1 | 12/2008 | Van De Ven et al. | |
| 2009/0001399 A1 | 1/2009 | Diana et al. | 257/98 |
| 2009/0002986 A1 | 1/2009 | Medendorp et al. | |
| 2009/0015137 A1* | 1/2009 | Su et al. | 313/503 |
| 2009/0040760 A1 | 2/2009 | Chen et al. | 362/249 |
| 2009/0046473 A1 | 2/2009 | Tsai et al. | 362/373 |
| 2009/0058256 A1 | 3/2009 | Mitsuishi et al. | 313/487 |
| 2009/0059559 A1 | 3/2009 | Pabst | |
| 2009/0067180 A1 | 3/2009 | Tahmosybayat | 362/339 |
| 2009/0086492 A1 | 4/2009 | Meyer | |
| 2009/0086508 A1 | 4/2009 | Bierhuizen | 362/617 |
| 2009/0095960 A1 | 4/2009 | Murayama | 257/79 |
| 2009/0101930 A1 | 4/2009 | Li | |
| 2009/0103293 A1 | 4/2009 | Harbers et al. | 362/231 |
| 2009/0103296 A1 | 4/2009 | Harbers et al. | |
| 2009/0108269 A1 | 4/2009 | Negley et al. | |
| 2009/0116217 A1 | 5/2009 | Teng et al. | |
| 2009/0140633 A1 | 6/2009 | Tanimoto et al. | 313/503 |
| 2009/0175041 A1 | 7/2009 | Yuen et al. | |
| 2009/0184618 A1 | 7/2009 | Hakata et al. | |
| 2009/0190353 A1 | 7/2009 | Barker | 362/249 |
| 2009/0195186 A1 | 8/2009 | Guest et al. | 315/294 |
| 2009/0201679 A1 | 8/2009 | Konaka | 362/235 |
| 2009/0217970 A1 | 9/2009 | Zimmerman et al. | 136/252 |
| 2009/0262516 A1 | 10/2009 | Li | 362/84 |
| 2009/0273727 A1 | 11/2009 | Kubota et al. | 349/62 |
| 2009/0273924 A1 | 11/2009 | Chiang | 362/241 |
| 2009/0283779 A1 | 11/2009 | Negley et al. | 257/88 |
| 2009/0296387 A1* | 12/2009 | Reisenauer et al. | 362/235 |
| 2009/0310368 A1 | 12/2009 | Incerti et al. | 362/326 |
| 2009/0316073 A1 | 12/2009 | Chen et al. | 349/64 |
| 2009/0316383 A1 | 12/2009 | Son | |
| 2009/0322197 A1 | 12/2009 | Helbing | |
| 2009/0322208 A1 | 12/2009 | Shaikevitch et al. | 313/503 |
| 2009/0322800 A1 | 12/2009 | Atkins | 345/690 |
| 2009/0323333 A1 | 12/2009 | Chang | |
| 2010/0014839 A1 | 1/2010 | Benoy et al. | 386/117 |
| 2010/0020547 A1 | 1/2010 | Olsson | 362/311 |
| 2010/0025700 A1 | 2/2010 | Jung et al. | |
| 2010/0026185 A1 | 2/2010 | Betsuda et al. | 315/32 |
| 2010/0027258 A1 | 2/2010 | Maxik et al. | 362/240 |
| 2010/0038660 A1 | 2/2010 | Shuja | 257/98 |
| 2010/0046231 A1 | 2/2010 | Medinis | 362/294 |
| 2010/0060144 A1 | 3/2010 | Justel et al. | 313/503 |
| 2010/0091487 A1 | 4/2010 | Shin | 362/235 |
| 2010/0096967 A1 | 4/2010 | Marinus et al. | 313/46 |
| 2010/0102707 A1 | 4/2010 | Fukuda et al. | 313/503 |
| 2010/0109575 A1 | 5/2010 | Ansems et al. | |
| 2010/0134047 A1 | 6/2010 | Hasnain | |
| 2010/0140655 A1 | 6/2010 | Shi | 257/99 |
| 2010/0149783 A1 | 6/2010 | Takenaka et al. | 362/84 |
| 2010/0149814 A1 | 6/2010 | Zhai et al. | 257/88 |
| 2010/0155763 A1 | 6/2010 | Donofrio | |
| 2010/0170075 A1 | 7/2010 | Kanade et al. | 29/428 |
| 2010/0177522 A1 | 7/2010 | Lee | 362/373 |
| 2010/0201284 A1 | 8/2010 | Kraus | |
| 2010/0207502 A1 | 8/2010 | Cao et al. | 313/46 |
| 2010/0219735 A1 | 9/2010 | Sakai et al. | 313/46 |
| 2010/0232134 A1 | 9/2010 | Tran | 362/84 |
| 2010/0244729 A1 | 9/2010 | Chen et al. | 315/291 |
| 2010/0246165 A1 | 9/2010 | Diaz et al. | 362/183 |
| 2010/0259918 A1 | 10/2010 | Rains, Jr. et al. | 362/84 |
| 2010/0264799 A1 | 10/2010 | Liu et al. | 313/46 |
| 2010/0314985 A1 | 12/2010 | Premysler | 313/46 |
| 2010/0327745 A1 | 12/2010 | Dassanayake et al. | 315/35 |
| 2010/0328925 A1 | 12/2010 | Hoelen et al. | 362/84 |
| 2011/0037368 A1 | 2/2011 | Huang | 313/46 |
| 2011/0044022 A1 | 2/2011 | Ko et al. | 362/84 |
| 2011/0058379 A1 | 3/2011 | Diamantidis | 362/296 |
| 2011/0068356 A1 | 3/2011 | Chiang et al. | 257/98 |
| 2011/0074271 A1 | 3/2011 | Takeshi et al. | 313/46 |
| 2011/0074296 A1 | 3/2011 | Shen et al. | 315/112 |
| 2011/0080096 A1 | 4/2011 | Dudik et al. | 315/112 |
| 2011/0080740 A1 | 4/2011 | Allen et al. | 362/294 |
| 2011/0089804 A1 | 4/2011 | Mahalingam et al. | 313/46 |
| 2011/0089830 A1 | 4/2011 | Pickard et al. | 315/32 |
| 2011/0095686 A1 | 4/2011 | Falicoff et al. | 315/35 |
| 2011/0133222 A1 | 6/2011 | Allen et al. | 257/88 |
| 2011/0149578 A1 | 6/2011 | Niiyama et al. | 362/294 |
| 2011/0175528 A1 | 7/2011 | Rains et al. | 315/51 |
| 2011/0176316 A1 | 7/2011 | Phipps et al. | |
| 2011/0205733 A1 | 8/2011 | Lenderink et al. | 362/231 |
| 2011/0215696 A1 | 9/2011 | Tong et al. | 313/46 |
| 2011/0216523 A1 | 9/2011 | Tong et al. | 362/84 |
| 2011/0242816 A1 | 10/2011 | Chowdhury et al. | 362/294 |
| 2011/0267835 A1 | 11/2011 | Boonekamp et al. | 362/555 |
| 2011/0273072 A1 | 11/2011 | Oki | 313/46 |
| 2011/0291560 A1 | 12/2011 | Wang et al. | 315/32 |
| 2011/0298371 A1 | 12/2011 | Brandes et al. | 315/32 |
| 2012/0040585 A1 | 2/2012 | Huang | |
| 2012/0155059 A1 | 6/2012 | Hoelen et al. | 362/84 |
| 2012/0161626 A1 | 6/2012 | Van de Ven et al. | 315/35 |
| 2012/0320591 A1 | 12/2012 | Liao et al. | 362/249 |
| 2013/0049018 A1 | 2/2013 | Ramer et al. | 257/81 |
| 2013/0063945 A1 | 3/2013 | Wu et al. | 362/249 |
| 2013/0119280 A1 | 5/2013 | Fuchi et al. | 250/504 R |
| 2013/0249374 A1 | 9/2013 | Lee et al. | 313/12 |
| 2013/0293098 A1 | 11/2013 | Li et al. | 313/512 |

FOREIGN PATENT DOCUMENTS

| | | |
|---|---|---|
| CN | 1608326 | 4/2005 |
| CN | 1726410 | 1/2006 |
| CN | 1767216 | 5/2006 |
| CN | 1802533 | 7/2006 |
| CN | 1802533 | 12/2006 |
| CN | 101128695 | 2/2008 |
| CN | 101262032 | 9/2008 |
| CN | 10126232 A | 10/2008 |
| CN | 1013388887 A | 1/2009 |
| CN | 101641623 | 2/2010 |
| CN | 102077011 | 5/2011 |
| DE | 3 916 875 | 12/1990 |
| DE | 10251955 A1 | 5/2004 |
| DE | 10-335077 | 3/2005 |
| DE | 1020040513 B2 | 4/2006 |
| DE | 102006061164 | 6/2008 |
| DE | 10 2007 037862 A1 | 10/2008 |
| DE | 202008013667 | 12/2008 |
| DE | 102011004718 | 8/2012 |
| EP | 0 838 866 | 4/1998 |
| EP | 0876085 | 11/1998 |
| EP | 0876085 A2 | 11/1998 |
| EP | 0890059 A1 | 1/1999 |
| EP | 0 971 421 | 1/2000 |
| EP | 1 024 399 | 8/2000 |
| EP | 1058221 A2 | 12/2000 |
| EP | 1 081 771 | 3/2001 |
| EP | 1 160 883 | 12/2001 |
| EP | 1 193 772 | 4/2002 |
| EP | 1 263 058 | 12/2002 |
| EP | 1 367 655 | 12/2003 |
| EP | 1 380 876 | 1/2004 |
| EP | 1 462 711 | 12/2004 |
| EP | 1 571 715 | 9/2005 |
| EP | 1 760 795 | 1/2006 |
| EP | 1881259 | 1/2008 |
| EP | 2146135 A2 | 1/2010 |
| EP | 2154420 | 2/2010 |
| EP | 2469154 | 6/2012 |

(56) References Cited

FOREIGN PATENT DOCUMENTS

| | | |
|---|---|---|
| FR | 2941346 | 7/2010 |
| GB | 2345954 A | 7/2000 |
| GB | 2 366 610 A | 3/2002 |
| GB | 2366610 | 3/2002 |
| GB | 2366610 A | 3/2002 |
| JP | H03081903 | 4/1991 |
| JP | 04-159519 | 6/1992 |
| JP | H06283006 | 10/1994 |
| JP | 09-146089 | 6/1997 |
| JP | H09265807 | 10/1997 |
| JP | 10-163535 | 6/1998 |
| JP | H11177149 | 7/1999 |
| JP | 11-213730 A | 8/1999 |
| JP | H11260125 | 9/1999 |
| JP | 2000-022222 | 1/2000 |
| JP | 2000022222 | 1/2000 |
| JP | 2000-183408 | 6/2000 |
| JP | 2000173304 | 6/2000 |
| JP | 2001-111114 | 4/2001 |
| JP | 2001118403 | 4/2001 |
| JP | 2001-156331 | 6/2001 |
| JP | 2001-307506 | 11/2001 |
| JP | 2002-150821 | 5/2002 |
| JP | 2002525814 | 8/2002 |
| JP | 2003-515-56 | 5/2003 |
| JP | 2003515899 | 5/2003 |
| JP | 2004-080046 | 3/2004 |
| JP | 2004-103443 | 4/2004 |
| JP | 2004146225 | 5/2004 |
| JP | 2004241318 | 8/2004 |
| JP | 2004-253309 | 9/2004 |
| JP | 2004-356116 | 12/2004 |
| JP | 2004-363055 | 12/2004 |
| JP | 2005-005482 | 1/2005 |
| JP | 2005-093097 A | 4/2005 |
| JP | 2005-101296 | 4/2005 |
| JP | 2005108700 | 4/2005 |
| JP | 20051008700 | 4/2005 |
| JP | 2005-142311 | 6/2005 |
| JP | 2005244226 | 9/2005 |
| JP | 2005-286267 | 10/2005 |
| JP | 2005277127 | 10/2005 |
| JP | 2005021635 | 11/2005 |
| JP | 2006019676 | 1/2006 |
| JP | 2006108661 | 4/2006 |
| JP | 2006148147 | 6/2006 |
| JP | 2006156187 | 6/2006 |
| JP | 20066159187 | 6/2006 |
| JP | WO 2006065558 | 6/2006 |
| JP | 200640850 A | 9/2006 |
| JP | 2006525648 | 11/2006 |
| JP | 2006331683 | 12/2006 |
| JP | 2007049019 | 2/2007 |
| JP | 200759930 | 3/2007 |
| JP | 2007081090 | 3/2007 |
| JP | 2007-122950 | 5/2007 |
| JP | 2007-141737 | 6/2007 |
| JP | 3138653 | 12/2007 |
| JP | 2008505448 | 2/2008 |
| JP | 200871793 | 3/2008 |
| JP | 2008091140 | 4/2008 |
| JP | 2008108835 | 5/2008 |
| JP | 2008523639 | 7/2008 |
| JP | 2008187195 | 8/2008 |
| JP | 2008262765 | 10/2008 |
| JP | 200828183 | 11/2008 |
| JP | 2008288409 | 11/2008 |
| JP | 2008300117 | 12/2008 |
| JP | 2008300203 | 12/2008 |
| JP | 2008300460 | 12/2008 |
| JP | 2008300570 | 12/2008 |
| JP | 2009-016058 A | 1/2009 |
| JP | 2009016058 | 1/2009 |
| JP | 2009016153 | 1/2009 |
| JP | 2009021264 | 1/2009 |
| JP | 2009059896 | 3/2009 |
| JP | 2009117346 | 5/2009 |
| JP | WO 2009093163 | 7/2009 |
| JP | U3153766 | 8/2009 |
| JP | WO 2009119038 | 10/2009 |
| JP | 2009266780 | 11/2009 |
| JP | 2009277586 | 11/2009 |
| JP | 2009295299 | 12/2009 |
| JP | WO 2009148543 | 12/2009 |
| JP | 2010016223 | 1/2010 |
| JP | 2010040494 | 2/2010 |
| JP | 2010050473 | 3/2010 |
| JP | 2010129300 | 6/2010 |
| JP | 2010267826 | 11/2010 |
| KR | WO 2009028861 | 3/2009 |
| KR | 100944181 | 2/2010 |
| KR | 1020100037353 | 4/2010 |
| KR | 100980588 B1 | 9/2010 |
| KR | 3020110008445 | 3/2011 |
| TW | 546854 | 8/2003 |
| TW | 200505054 | 2/2005 |
| TW | 200507686 | 2/2005 |
| TW | 200527664 | 8/2005 |
| TW | 2006033434 | 2/2006 |
| TW | 200618339 | 6/2006 |
| TW | 200619744 | 6/2006 |
| TW | M309750 | 4/2007 |
| TW | 200739151 | 10/2007 |
| TW | 200806922 | 2/2008 |
| TW | 200907239 | 2/2009 |
| TW | 200928435 | 7/2009 |
| TW | 2009028435 | 7/2009 |
| TW | 200938768 | 9/2009 |
| TW | 200943592 | 10/2009 |
| TW | D134005 | 3/2010 |
| TW | 100300960 | 3/2011 |
| TW | D141681 | 7/2011 |
| WO | 98/43014 | 10/1998 |
| WO | 99/66483 | 12/1999 |
| WO | WO 00/17569 A1 | 3/2000 |
| WO | 00/34709 | 6/2000 |
| WO | WO 0124583 A1 | 4/2001 |
| WO | 01/41215 | 6/2001 |
| WO | 01/43113 | 6/2001 |
| WO | WO 01/40702 A1 | 6/2001 |
| WO | WO 0160119 A2 | 8/2001 |
| WO | WO 0169692 | 9/2001 |
| WO | 03/056876 | 7/2003 |
| WO | 03/091771 | 11/2003 |
| WO | WO 2004100213 A2 | 5/2004 |
| WO | WO 2004068599 | 8/2004 |
| WO | WO 2004068909 | 8/2004 |
| WO | WO 2004100213 | 11/2004 |
| WO | 2005/004202 | 1/2005 |
| WO | 2005013365 | 2/2005 |
| WO | 2005/104253 | 11/2005 |
| WO | WO 2005104247 | 11/2005 |
| WO | WO 2005107420 A2 | 11/2005 |
| WO | 2005124877 | 12/2005 |
| WO | WO 2006012043 | 2/2006 |
| WO | 2006/028312 | 3/2006 |
| WO | 2006/061728 A2 | 6/2006 |
| WO | WO 2006061728 | 6/2006 |
| WO | WO 2006065558 | 6/2006 |
| WO | WO 2006121196 | 11/2006 |
| WO | WO 2007061758 | 5/2007 |
| WO | WO 2007/130358 A2 | 11/2007 |
| WO | WO 2007146566 A2 | 12/2007 |
| WO | WO 2008/018002 A2 | 2/2008 |
| WO | WO 2008018002 | 2/2008 |
| WO | WO 2008134056 A1 | 4/2008 |
| WO | WO 2008/052318 A1 | 5/2008 |
| WO | WO 2008/117211 A1 | 10/2008 |
| WO | WO 2008/146229 A2 | 12/2008 |
| WO | WO 2008146229 | 12/2008 |
| WO | WO 2009/024952 A2 | 2/2009 |
| WO | WO 2009052099 | 4/2009 |
| WO | WO 2009/091562 A2 | 7/2009 |
| WO | WO 2009/093163 A2 | 7/2009 |

(56) References Cited

FOREIGN PATENT DOCUMENTS

| WO | WO 2009091562 | | 7/2009 |
|---|---|---|---|
| WO | WO 2009093163 | | 7/2009 |
| WO | WO 2009093163 | A2 | 7/2009 |
| WO | WO 2009/107052 | A1 | 9/2009 |
| WO | WO 2009107052 | | 9/2009 |
| WO | WO 2009/119038 | A2 | 10/2009 |
| WO | WO 2009/128004 | A1 | 10/2009 |
| WO | WO 2009119038 | | 10/2009 |
| WO | WO 2009125314 | A2 | 10/2009 |
| WO | WO 2009131627 | | 10/2009 |
| WO | WO 2009143047 | A2 | 11/2009 |
| WO | WO 2009/158422 | A1 | 12/2009 |
| WO | WO 2009158422 | | 12/2009 |
| WO | WO 2009158422 | A1 | 12/2009 |
| WO | WO 2010/012999 | A2 | 2/2010 |
| WO | WO 2010012999 | | 2/2010 |
| WO | WO 2010013893 | | 2/2010 |
| WO | WO 2010052640 | | 5/2010 |
| WO | WO 2010/119618 | A1 | 10/2010 |
| WO | WO 2010/128419 | A1 | 11/2010 |
| WO | WO 2011100193 | | 8/2011 |
| WO | WO 2011109091 | A1 | 9/2011 |
| WO | WO 2011109098 | | 9/2011 |
| WO | WO 2012011279 | | 1/2012 |
| WO | WO 2012031533 | | 3/2012 |

OTHER PUBLICATIONS

International Search Report and Written Opinion for PCT/US2011/000400 mailed May 2, 2011.
Cree XLAMP® XP-G LED, Product Info and Data Sheet, 14 Pages.
Cree XLAMP® XP-E LED, Product Info and Data Sheet, 20 Pages.
International Search Report and Written Opinion from PCT Application No. PCT/US2011/000389, dated May 6, 2013.
International Search Report and Written Opinion from PCT Application No. PCT/US2011/000390, dated May 6, 2013.
International Preliminary Report on Patentability from PCT/US2011/00389, dated May 8, 2013.
International Preliminary Report on Patentability from PCT/US2011/000390, dated May 8, 2013.
Reasons for Rejection from Japanese Patent Appl. No. 2011-198454, dated Mar. 7, 2013.
Notice to Submit a Response from Korean Patent Application No. 30-2011-0008448, dated Apr. 16, 2012.
Notice to Submit a Response from Korean Patent Application No. 30-2011-0008445, dated Apr. 16, 2012.
Notice to Submit a Response from Korean Patent Application No. 30-2011-0008446, dated Apr. 16, 2012.
Office Action for Taiwanese Patent Application No. 100300961, dated May 7, 2012.
Office Action from Taiwanese Patent Application No. 100300960, dated May 7, 2012.
International Search Report and Written Opinion for PCT Application No. PCT/US2011/000399 mailed Jul. 12, 2011.
Decision to Refuse a European Patent Application for EP 09 152 962.8 dated Jul. 6, 2011.
International Search Report and Written Opinion for PCT/US2011/000403 mailed Aug. 23, 2011.
International Search Report and Written Opinion for counterpart PCT/US2011/000404 mailed Aug. 25, 2011.
International Search Report and Written Opinion for PCT/US2011/000398 mailed Aug. 30, 2011.
International Search Report and Written Opinion for PCT/US2011/000406 mailed Sep. 15, 2011.
International Search Report and Written Opinion from PCT Application No. PCT/US2012/044705 dated Oct. 9, 2012.
Notice to Submit a Response from Korean Patent Application No. 30-2011-0008446, dated Oct. 22, 2012.
Notice to Submit a Response from Korean Design Patent Application No. 30-2011-0024961, dated Sep. 10, 2012.
International Search Report and Written Opinion for PCT Application No. PCT/US2011/000391 mailed Oct. 6, 2011.
International Search Report and Written Opinion for PCT Application No. PCT/US2011/000402 mailed Sep. 30, 2011.
International Search Report and Written Opinion for PCT Application No. PCT/US2011/000397 mailed May 24, 2011.
International Search Report and Written Opinion for PCT Application No. PCT/US2010/003146 mailed Jun. 7, 2011.
Decision for Final Rejection for Japanese Patent Application No. 2001-542133 mailed Jun. 28, 2011.
International Search Report and Written Opinion, PCT/US2009/063804, Mailed on Feb. 26, 2010.
U.S. Appl. No. 12/566,195, Van De Ven.
U.S. Appl. No. 12/704,730, Van De Ven.
C.Crane Geobulb® -II LED Light Bulb, Item #2SW, Description, p. 1-2.
C.Crane Geobulb® -II LED Light Bulb, Item #2SW, Specs, p. 1-2.
Cree LR4, 4" Recessed Architectural Downlight, Product Info p. 1-2.
Cree LR6, 6" Recessed Downlight Module, Product Info, p. 1-2.
U.S. Appl. No. 12/901,405, filed Oct. 8, 2010, Tong.
U.S. Appl. No. 61/339,515, filed Mar. 3, 2010, Tong.
U.S. Appl. No. 12/848,825, filed Aug. 2, 2010, Tong.
U.S. Appl. No. 11/656,759, filed Jan. 22, 2007, Chitnis.
U.S. Appl. No. 11/899,790, filed Sep. 7, 2007, Chitnis.
U.S. Appl. No. 11/473,089, filed Jun. 21, 2006, Tarsa.
U.S. Appl. No. 61/435,759, filed Jan. 24, 2011, Le.
U.S. Appl. No. 61/339,516, filed Mar. 3, 2010, Tong.
International Search Report and Written Opinion for PCT Patent Application No. PCT/US2011/000405 mailed Nov. 2, 2011.
International Search Report and Written Opinion for PCT/US2011/000407 mailed Nov. 16, 2011.
Office Action of the IPO for Taiwan Patent Application No. TW 100300962 issued Nov. 21, 2011.
Office Action of the IPO for Taiwan Patent Application No. TW 100300961 issued Nov. 16, 2011.
Office Action of the IPO for Taiwan Patent Application No. TW 100300960 issued Nov. 15, 2011.
Office Action of the IPO for Taiwan Patent Application No. TW 100302770 issued Jan. 13, 2012.
Office Action from Japanese Patent Appl. No. 2012-556064, dated Oct. 29, 2013.
Office Action from U.S. Appl. No. 13/029,063, dated Oct. 23, 2013.
Office Action from U.S. Appl. No. 13/028,946, dated Oct. 31, 2013.
Office Action from U.S. Appl. No. 13/029,068, dated Nov. 15, 2013.
Office Action from U.S. Appl. No. 13/029,025, dated Dec. 6, 2013.
Notice of Reasons for Rejection from Japanese Patent Appl. No. 2012-543086, dated Dec. 24, 2013.
Office Action from Japanese Patent Appl. No. 2012-556062, dated Dec. 20, 2013.
International Preliminary Report on Patentability and Written Opinion from PCT/US2012/044705 dated Jan. 7, 2014.
First Office Action from Chinese Patent Appl. No. 201080062056.X, dated Feb. 12, 2014.
Office Action from U.S. Appl. No. 13/028,913, dated Feb. 19, 2014.
Office Action from U.S. Appl. No. 13/430,478, dated Feb. 21, 2014.
Office Action from U.S. Appl. No. 13/358,901, dated Mar. 6, 2014.
Office Action from U.S. Appl. No. 13/018,291, dated Mar. 7, 2014.
Office Action from U.S. Appl. No. 13/029,025, dated Mar. 19, 2014.
Office Action from Japanese Patent appl. No. 2012-556063, dated Jan. 28, 2014.
Comments on the Written Opinion and Amendment of the Application from European Patent appl. No. 12740244.4, dated Feb. 20, 2014.
International Search Report and Written Opinion from PCT/US2013/057712 dated Feb. 4, 2014.
Office Action from U.S. Appl. No. 11/149,999, dated Jan. 15, 2014.
Office Action from U.S. Appl. No. 13/034,501, dated Jan. 23, 2014.
Office Action from U.S. Appl. No. 13/028,946, dated Jul. 16, 2012.
Response to OA from U.S. Appl. No. 13/028,946, filed Oct. 8, 2012.
Office Action from U.S. Appl. No. 13/029,025, dated Jul. 16, 2013.
Office Action from U.S. Appl. No. 13/430,478, dated Jun. 18, 2013.
Office Action from U.S. Appl. No. 12/901,405, dated Jul. 1, 2013.
Office Action from U.S. Appl. No. 13/018,291, dated Oct. 10, 2012.

(56) References Cited

OTHER PUBLICATIONS

Response to OA from U.S. Appl. No. 13/018,291, filed Jan. 7, 2013.
Office Action from U.S. Appl. No. 13/022,490, dated Nov. 7, 2012.
Response to OA from U.S. Appl. No. 13/022,490, filed Feb. 1, 2013.
Office Action from U.S. Appl. No. 13/034,501, dated Dec. 3, 2012.
Response to OA from U.S. Appl. No. 13/034,501, filed Apr. 3, 2013.
Office Action from U.S. Appl. No. 13/028,946, dated Dec. 4, 2012.
Response to OA from U.S. Appl. No. 13/028,946, filed Jan. 29, 2013.
Office Action from U.S. Appl. No. 13/029,005, dated Jan. 24, 2013.
Office Action from U.S. Appl. No. 12/901,405, dated Jan. 9, 2013.
Response to OA from U.S. Appl. No. 12/901,405, filed Apr. 29, 2013.
Office Action from U.S. Appl. No. 12/985,275, dated Feb. 28, 2013.
Response to OA from U.S. Appl. No. 12/985,275, filed May 28, 2013.
Office Action from U.S. Appl. No. 13/018,291, dated Mar. 20, 2013.
Response to OA from U.S. Appl. No. 13/018,291, filed May 20, 2013.
Office Action from U.S. Appl. No. 13/022,490, dated Apr. 2, 2013.
Office Action from U.S. Appl. No. 13/018,291, dated May 31, 2013.
Office Action from U.S. Appl. No. 12/636,958, dated Jul. 19, 2012.
Response to OA from U.S. Appl. No. 12/636,958, filed Nov. 19, 2012.
Office Action from U.S. Appl. No. 13/054,501, dated May 31, 2013.
Office Action from U.S. Appl. No. 13/028,946, filed Apr. 11, 2013.
Office Action from U.S. Appl. No. 13/028,913, dated Apr. 29, 2013.
Office Action from U.S. Appl. No. 13/029,005, dated Jan. 4, 2013.
Response to OA from U.S. Appl. No. 13/029,005, filed Apr. 17, 2013.
Office Action from U.S. Appl. No. 12/848,825, dated Nov. 5, 2012.
Response to OA from U.S. Appl. No. 12/848,825, filed Feb. 5, 2013.
Office Action from U.S. Appl. No. 13/029,005, dated Jun. 11, 2013.
Notice of Reasons for Rejection from Japanese Patent Appl. No. 2012-543086, dated Aug. 27, 2013.
Office Action from U.S. Appl. No. 13/022,490, dated Oct. 17, 2013.
Office Action from U.S. Appl. No. 11/149,999, dated May 13, 2013.
Response to OA from U.S. Appl. No. 11/149,999, filed Sep. 13, 2013.
Office Action from U.S. Appl. No. 12/985,275, dated Aug. 27, 2013.
Office Action from U.S. Appl. No. 13/358,901, dated Oct. 9, 2013.
Office Action from Japanese Patent Appl. No. 2012-556065, dated Oct. 25, 2013.
Decision of Dismissal of Amendment, Decision of Rejection from Japanese Patent Appl. No. 2011-231319, dated Oct. 15, 2013.
Office Action from Japanese Patent Appl. No. 2012-556063, dated Oct. 11, 2013.
Office Action from Japanese Patent Appl. No. 2012-556066. dated Oct. 25, 2013.
Office Action from U.S. Appl. No. 13/028,913, dated Nov. 4, 2013.
First Office Action from Chinese Patent Appl. No. 2011800223856, dated Aug. 1, 2014.
First Office Action from Chinese Patent Appl. No. 2011800226248, dated Aug. 25, 2014.
Official Action from European Patent Appl. No. 11710348.1-1757, dated Oct. 9, 2014.
Office Action from Japanese Patent Appl. No. 2012-556065, dated Aug. 5, 2014.
Office Action from Japanese Patent Appl. No. 2012-556062, dated Aug. 5, 2014.
First Office Action from Chinese Patent Appl. No. 2011800223837, dated Jul. 24, 2014.
Office Action from European Patent Appl. No. 11710906.6-1757, dated Sep. 10, 2014.
Office Action from Japanese Patent Appl. No. 2014-122643, dated Apr. 10, 2015.
Notice of Decline of Amendments and Final Office Action from Japanese Appl. No. 2012-556065, dated Apr. 10, 2015.
Third Office Action from Chinese Patent Appl. No. 2011800207069, dated Apr. 13, 2015.
Office Action from Taiwanese Patent Appl. No. 100107048, dated Apr. 24, 2015.
Second Office Action from Chinese Patent Appl. No. 2011800223837, dated Apr. 13, 2015.
Communication from European Patent Appl. No. 13762957.2-1757, dated Apr. 30, 2015.
Second Office Action from Chinese Patent Appl. No. 2011800226248, dated May 4, 2015.
Office Action from Taiwanese Appl. No. 100107047, dated Jun. 5, 2015.
Second Office Action from Chinese Appl. No. 201180022620X, dated Apr. 20, 2015.
Office Action from Taiwanese Appl. No. 100107040, dated Jun. 5, 2015.
Office Action from Taiwanese Patent Appl. No. 10420724800, dated Jun. 2, 2015.
Office Action from U.S. Appl. No. 13/029,068, dated Mar. 31, 2015.
Office Action from U.S. Appl. No. 11/149,999, dated Mar. 31, 2015.
Office Action from U.S. Appl. No. 13/018,245, dated May 28, 2015.
Office Action from U.S. Appl. No. 13/758,763, dated Jun. 5, 2015.
Second Office Action from Chinese Appl. No. 201080062056.X, dated Sep. 29, 2014.
First Office Action and Search Report from Chinese Appl. No. 2011800223856, dated Aug. 1, 2014.
Communication from European Appl. No. 12816621.2-1757, dated Sep. 25, 2014.
Pretrial Report from Japanese Patent Appl. No. 2011-231319, dated Apr. 14, 2014.
Summons to Oral Proceedings from European Patent Appl. No. 09152962/2166580, dated Jan. 29, 2015.
First Office Action from Chinese Patent Appl. No. 2011800225832, dated Jan. 20, 2015.
First Office Action from Chinese Patent Appl. No. 2011800226214, dated Dec. 25, 2014.
First Office Action from Chinese Patent Appl. No. 201180022626.7, dated Nov. 15, 2014.
Second Office Action from Chinese Appl. No. 201180022606X, dated Dec. 23, 2014.
Appeal Decision from Japanese Appl. No. 2011-231319, dated Jan. 13, 2015.
Office Action from U.S. Appl. No. 13/607,300, dated Nov. 19, 2014.
Office Action from U.S. Appl. No. 13/029,025, dated Dec. 11, 2014.
Office Action from U.S. Appl. No. 13/018,245, dated Dec. 11, 2014.
Office Action from U.S. Appl. No. 13/029,068, dated Dec. 23, 2014.
Office Action from U.S. Appl. No. 12/985,275, dated Dec. 29, 2014.
Office Action from Taiwanese Appl. No. 101107038, dated Jul. 21, 2015.
Search Report and Office Action from Taiwanese Patent Appl. No. 099143827, dated Jun. 12, 2015.
Office Action from Taiwanese Patent Appl. No. 100107012, dated Jul. 22, 2015.
Decision of Board of Appeal and Minutes of Oral Proceedings from European Appl. No. 09152962, dated Jun. 2, 2015.
Decision to Grant from Chinese Patent Appl. No. 201080062056.X, dated Jul. 6, 2015.
Office Action from Taiwanese Patent Appl. No. 100107042, dated Jun. 2, 2015.
Office Action from Taiwanese Patent Appl. No. 100107047, dated Jun. 2, 2015.
Office Action from Taiwanese Patent Appl. No. 100107040, dated Jun. 2, 2015.
Office Action from Taiwanese Patent Appl. No. 100107044, dated Jun. 1, 2015.
Third Office Action from Chinese Patent Appl. No. 201180022606X, dated Jun. 10, 2015.
Second Office Action and Search Report from Chinese Patent Appl. No. 2011800207092, dated Jan. 22, 2015.
Examination Report from European Patent Appl. No. 11 710 348.1-1757, dated Feb. 18, 2015.
Examination Report from European Patent Appl. No. 11 710 906.6-1757, dated Feb. 18, 2015.
Examination Report from European Patent Appl. No. 12 740 244.4-1757, dated Feb. 9, 2015.
Office Action from U.S. Appl. No. 13/029,063, dated Jan. 13, 2015.
Office Action from U.S. Appl. No. 14/014,272, dated Jan. 14, 2015.
Response to OA from U.S. Appl. No. 14/014,272, filed Mar. 3, 2015.
Office Action from U.S. Appl. No. 12/901,405, dated Feb. 4, 2015.
Office Action from U.S. Appl. No. 13/029,068, dated Sep. 26, 2014.

(56) References Cited

OTHER PUBLICATIONS

Response to OA from U.S. Appl. No. 13/029,068, filed Nov. 18, 2014.
Office Action from U.S. Appl. No. 13/358,901, dated Oct. 31, 2014.
Office Action from U.S. Appl. No. 13/430,478, dated Nov. 5, 2014.
Office Action from U.S. Appl. No. 13/034,501, dated Nov. 5, 2014.
Decision to Grant from Japanese Appl. No. 2012-556062, dated Nov. 27, 2014.
Second Office Action from Chinese Patent Appl. No. 201180020706.9, dated Dec. 5, 2014.
First Office Action from Chinese Patent Application No. 201180020706.9, dated May 5, 2014.
First Office Action and Search Report from Chinese Patent Appl. No. 201180022620X, dated Jul. 1, 2014.
Office Action from U.S. Appl. No. 13/358,901, dated Jul. 15, 2014.
Response to OA from U.S. Appl. No. 13/358,901, filed Aug. 21, 2014.
Office Action from U.S. Appl. No. 13/340,478, dated Jul. 23, 2014.
Office Action from U.S. Appl. No. 14/014,272, dated Jul. 29, 2014.
Office Action from U.S. Appl. No. 13/029,025, dated Aug. 6, 2014.
Office Action from U.S. Appl. No. 12/985,275, dated Aug. 7, 2014.
Office Action from U.S. Appl. No. 12/901,405, dated Aug. 7, 2014.
Office Action from U.S. Appl. No. 13/029,063, dated Apr. 1, 2014.
Office Action from U.S. Appl. No. 12/985,275, dated Apr. 10, 2014.
Office Action from U.S. Appl. No. 13/029,068, dated Apr. 24, 2014.
Office Action from U.S. Appl. No. 13/034,501, dated May 5, 2014.
Office Action from U.S. Appl. No. 13/022,490, dated May 6, 2014.
Office Action from Japanese Patent Appl. No. 2012-556066, dated Mar. 14, 2014.
Office Action from U.S. Appl. No. 13/029,068, dated Jun. 13, 2014.
Office Action from U.S. Appl. No. 13/018,245, dated Jun. 10, 2014.
Decision to Grant from Japanese Patent Appl. No. 2012-556066, dated Jul. 4, 2014.
Decision of Rejection from Japanese Patent Appl. No. 2012-556064, dated Jun. 6, 2014.
Narendran, et al., Solid State Lighting; Failure Analysis of White LEDs, Journal of Crystal Growth, vol. 268, Issues 1-4, Aug. 2004, Abstract.
Narendran, et al., "Color Rendering Properties of LED Light Sources", 2002, pp. 1-8.
U.S. Dept. of Energy, DOE Solid-State Lighting CALiPER Program, Summary of Results: Round 3 of Product Testing, Oct. 2007.
U.S. Dept of Energy, "DOE Solid-State Lighting CALiPER Program, Summary of Results: Round 4 of Product Testing", Jan. 2008.
U.S. Dept. of Energy, "DOE Solid-State Lighting CALiPER Program, Summary of Results. Round 5 of Product Testing", May 2008.
Kim, et al., "Strongly Enhanced Phosphor Efficiency in GaInN White Light-Emitting Diodes Using Remote Phosphor Configuration and Diffuse Reflector Cup", Japanese Journal of Applied Physics 44(21):L649-L651 (2005).
Invitation to Pay Additional Fees and, Where Applicable, Protest Fee (7 pages) corresponding to International Appl. No. PCT/US2008/009234; Date Nov. 14, 2008.
International Search Report and Written Opinion (11 pages) corresponding to International Appl No. PCT/US2007/01382: date Feb. 20, 2008.
International Search Report and Written Opinion (15 pages) corresponding to International Appl. No. PCT/US2009/002193: dated Jul. 20, 2009.
Office Action from Taiwanese Patent Appl. No. 097102415, Oct. 16, 2013.
Second Office Action from Chinese Patent App. No. 200980121269.2, dated Dec. 19, 2012.
Office Action from Japanese Patent Appl. No. 2011-506258, dated Sep. 14, 2012.
Press Release from LED Lighting Fixtures dated May 4, 2007 entitled "LED Lighting Fixtures to Expand Product Line".
OptoLED Lighting, Inc., OptoLED Product Information, 2009, Publisher: OptoLED GmBH website: accessed at http://222.optoled.de/english/products/led.html.
Permlight, Inc., Enbryten LED Product Info., Feb. 2005, from Permlight, Inc., website: http://www.webarchive.org displaying that www.permlight.com/products/LEDfixtures.asp was publicly available Jan. 2004.
Press Release from LED Lighting Fixtures dated Apr. 24, 2006 entitled "LED Lighting Fixtures, Inc. achieves unprecedented gain in light output from new luminaire".
Press Release from LED Lighting Fixtures dated Feb. 16, 2006 entitled "LED Lighting Fixtures, Inc. Announces Record Performance".
Press Release from LED Lighting Fixtures dated Feb. 7, 2007 entitled "LED Lighting Fixtures, Inc. Announces its first LED-based Recessed Down Light".
Press Release from LED Lighting Fixtures dated Jan. 26, 2006 entitled "LED Lighting Fixtures, Creates 750 Lumen Recessed Light and Uses Only 16 Watts of Power".
Press Release from LED Lighting Fixtures dated May 30, 2006 entitled "LED Lighting Fixtures, Inc. Sets World Record at 80 Lumens per Watt for Warm White Fixture".
Shimizu, "Development of High-Efficiency LED Downlight", First International Conference on White LEDs and Solid State Lighting, Nov. 30, 2007.
Van De Ven, et al., "Warm White Illumination with High CRI and High Efficacy by Combining 455 nm Excited Yellowish Phosphor LEDs and Red AlInGap LEDs," First International Conference on White LEDs and Solid State Lighting, Nov. 30, 2007.
Color Kinetics, Inc., Color Kinetics Support: White Papers & Presentations: available at http://www.colorkinetics.com/support/whitepapers/: Solid State Lighting White Papers & Presentations, Feb. 22, 2006, pp. 1-4.
Color Kinetics, Inc., "Color Quality of Intelligent Solid-State Light Systems". Color Quality of Solid-State Light Sources, Mar. 2005, pp. 1.3.
CSA International, "Test Data Report", Project No. 1786317. Report No. 1786317-1 (Apr. 2006).
DOE SSL CALiPer Report, "Product Test Reference: CALiPer 07-31 Downlight Lamp".
DOE SSL CALiPer Report, "Product Test Reference: CALiPer 07-47 Downlight Lamp".
Krames et al., Lumileds Lighting, Light from Silicon Valley, Progress and Future Direction of LED Technology, SSL Workshop, Nov. 13, 2003, Publisher: Lumileds Lighting, Inc., pp. 1-21.
Press Release from LED Lighting Fixtures dated Nov. 28, 2007 entitled "New Lamp from LED Lighting Fixtures Shatter World Record for Energy Efficiency".
Schlotter, et al., "Luminescence Conversion of Blue Light Emitting Diodes". App. Phys. A. 64, 417-418 (1997).
U.S. Appl. No. 11/613,692, filed Dec. 20, 2006.
U.S. Appl. No. 11/614,180, filed Dec. 21, 2006.
U.S. Appl. No. 11/624,811, filed Jan. 19, 2007.
U.S. Appl. No. 11/626,483, filed Jan. 24, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/755,162, filed May 30, 2007.
U.S. Appl. No. 11/854,744, filed Sep. 13, 2007.
U.S. Appl. No. 11/936,163, filed Nov. 7, 2007.
U.S. Appl. No. 11/843,243, filed Aug. 22, 2007.
U.S. Appl. No. 11/948,021, filed Nov. 30, 2007.
U.S. Appl. No. 11/870,679, filed Oct. 11, 2007.
U.S. Appl. No. 12/017,558, filed Jan. 22, 2008.
U.S. Appl. No. 12/017,600, filed Jan. 22, 2008.
U.S. Appl. No. 12/057,748, filed Mar. 28, 2008.
U.S. Appl. No. 11/743,324, filed May 2, 2007.
U.S. Appl. No. 11/032,363, filed Jan. 10, 2005.
U.S. Appl. No. 61/075,513, filed Jun. 25, 2008.
Boehlen et al., "Laser micro-machining of high density optical structures on large substrates," Proc. of SPIE Vo 5339, 2004, pp. 118-126.
White Light LED, Part Nos. NSPW300BS and NSPW312BS, High Brightness LEDs, Nov. 12, 1999, Publisher: Nichia Corporation.

(56) References Cited

OTHER PUBLICATIONS

Chhajed, S., *Influence of junction temperature on chromaticity and color-rendering properties of trichromatic white-light sources . . .* , Journal of Applied Physics, 2005, vol. 97pp. 1-8.
Compound Semiconductors Online, "LED Lighting Fixtures, Inc. Sets World Record at 80 Lumens per Watt for Warm White", Compound Semiconductors Online, May 30, 2006, pp. 1.
Cree, Inc., "Cree® Xlamp® 7090 XR-B Series LED Binning and Labeling," Application Note: CLD-AP08.000, 7pp (2006).
First Office Action from Chinese Patent Application No. 201180022606, dated May 4, 2014.
First Office Action from Chinese Patent Appl. No. 201180020709.2, dated May 4, 2014.
Office Action from U.S. Appl. No. 13/028,946, dated May 27, 2014.
Office Action from U.S. Appl. No. 13/028,913, dated May 22, 2014.
Notice of Decline of Amendments and Final Office Action from Japanese Appl. No. 2012-556065. dated Apr. 10, 2015.
Third Office Action from Chinese Patent Appl, No. 2011800207069, dated Apr. 13, 2015.
Second Office Action from Chinese Patent Appl. No. 2011800223856, dated Apr. 16, 2015.
Office Action from Taiwanese Patent Appl. No. 100107048. dated Apr. 24, 2015.
Second Office Action from Chinese Patent Appl, No. 2011800223837, dated Apr. 13, 2015.
Communication from European Patent Appl. No. 13762957.2 - 1757. dated Apr. 30, 2015.
Office Action and Search Report from Taiwanese Patent Appl. No. 100107051, dated May 12, 2015.
Second Office Action from Chinese Patent Appl, No. 2011800226248, dated May 4, 2015.
Office Action from Taiwanese Appl. No. 100107047, dated Jun. 5. 2015.
Second Office Action from Chinese Appl. No. 201180022620X, dated Apr. 20. 2015.
Office Action from Taiwanese Appl. No. 100107040, dated Jun. 5. 2015.
Office Action from Taiwanese Patent Appl. No 10420724800, dated Jun. 2, 2015.
Office Action from U.S. Appl. No. 13/029.068, dated Mar. 31, 2015.
Office Action from U.S. Appl. No. 11/149,999. dated Mar. 31, 2015.
Office Action from U.S. Appl. No. 12/985,275, dated Apr. 3, 2015.
Office Action from U.S. Appl. No. 13/430,478, dated Apr. 22, 2015.
Office Action from U.S. Appl. No. 13/029,025, dated Apr. 29, 2015.
Office Action from U.S. Appl. No. 13/018,245. dated May 28, 2015.
Office Action from U.S. Appl. No. 13/758.763. dated Jun. 5, 2015.
Office Action from U.S. Appl. No. 14/185,123, dated Jun. 9, 2015.
Examination from European Patent Appl. No. 10799139.0, dated Nov. 18. 2015.
Request for Correction from Chinese Patent Appl. No, 201180022606X, dated Nov, 12, 2015.
Third Office Action from Chinese Patent Appl. No. 2011800223856, dated Nov. 2, 2015.
Office Action from U.S. Appl. No. 13/536.707. dated Nov. 16, 2015.
Office Action from U.S. Appl. No. 14/185,123. dated Nov. 17, 2015.
Office Action from U.S. Appl. No. 13/029,068, dated Dec. 3, 2015.
Office Action from U.S. Appl. No. 14/453,482. dated Oct. 1, 2015.
Office Action from U.S. Appl. No. 14/108,815. dated Nov. 5, 2015.

\* cited by examiner

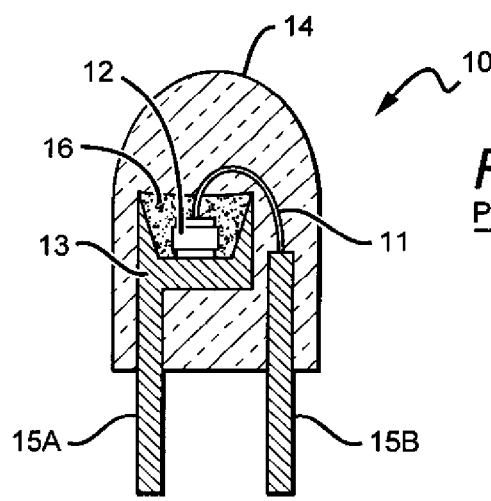
*FIG. 1*
PRIOR ART
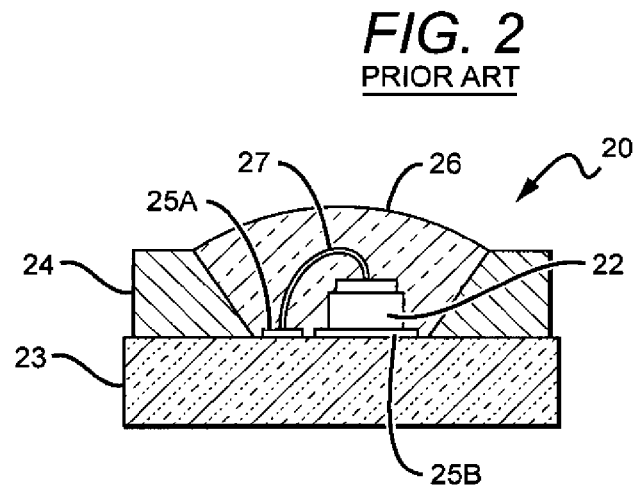
*FIG. 2*
PRIOR ART
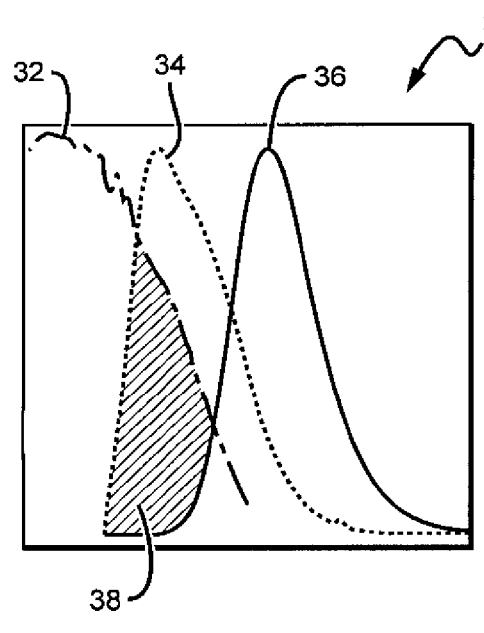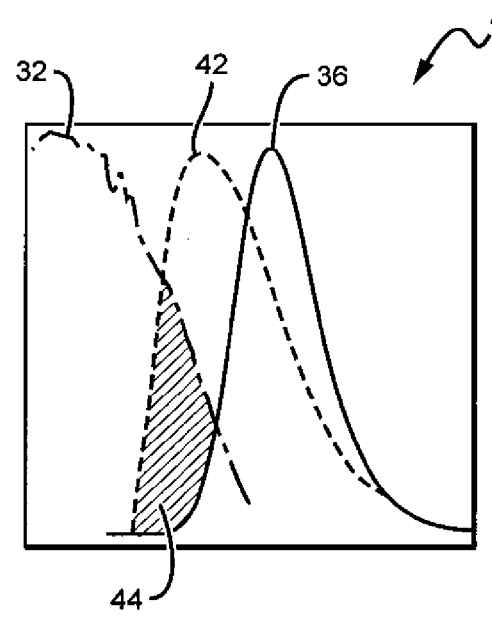
*FIG. 3*

| Phos: BG301B (Green) + R618nm (Red) | Separated | Mixed |
|---|---|---|
| CIE Color Points | (0.438, 0.407) | (0.437, 0.403) |
| CCT | 3010 | 3000 |
| CRI | 88.5 | 78.5 |
| lm/W-opt | 327 | 339 |
| Stokes' loss | 23.4 | 23.1% |
| Overall C.E. (%) | 45.2% | 46.1% |
| Green CE (%) | 51.0% | 46.1% |
| Red CE (%) | 41.5% | 46.1% |
| Normalized LPW (assuming blue WPE 48%) | 88.3 | 93.4 |

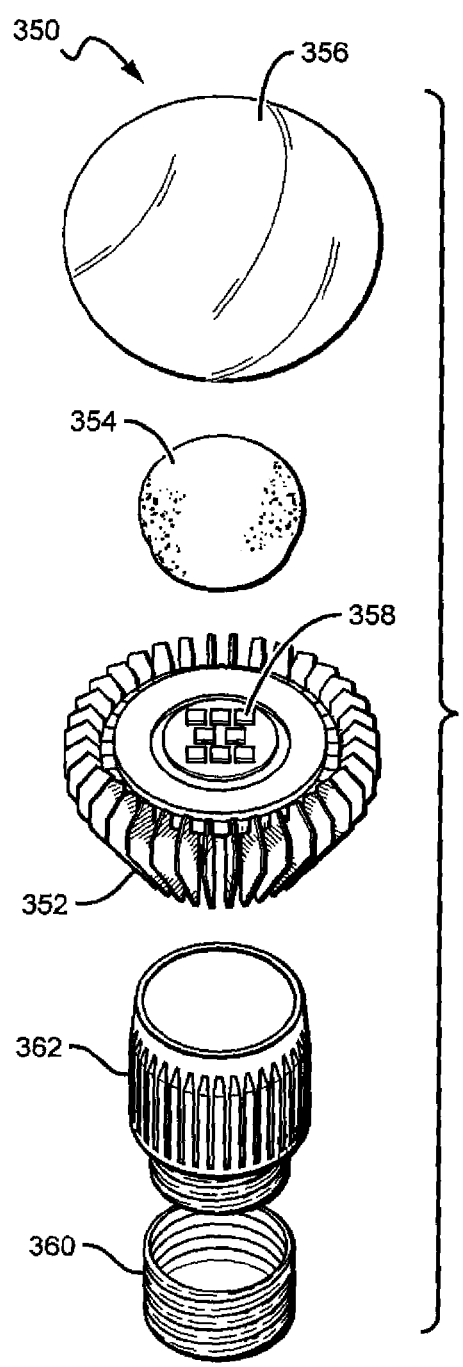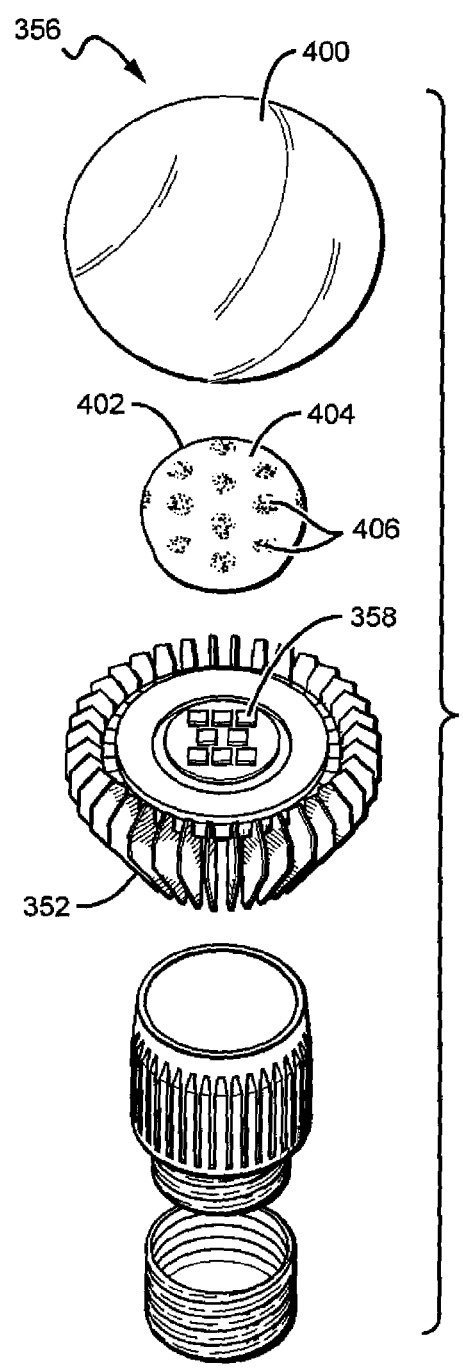

ENHANCED COLOR RENDERING INDEX EMITTER THROUGH PHOSPHOR SEPARATION

This application claims the benefit of U.S. Provisional Patent Application Ser. No. 61/339,516, filed on Mar. 3, 2010, U.S. Provisional Patent Application Ser. No. 61/339,515, filed on Mar. 3, 2010, U.S. Provisional Patent Application Ser. No. 61/386,437, filed on Sep. 24, 2010, U.S. Provisional Application Ser. No. 61/424,665, filed on Dec. 19, 2010, U.S. Provisional Application Ser. No. 61/424,670, filed on Dec. 19, 2010, U.S. Provisional Patent Application Ser. No. 61/434,355, filed on Jan. 19, 2011, U.S. Provisional Patent Application Ser. No. 61/435,326, filed on Jan. 23, 2011, U.S. Provisional Patent Application Ser. No. 61/435,759, filed on Jan. 24, 2011. This application is also a continuation-in-part from, and claims the benefit of, U.S. patent application Ser. No. 12/848,825, filed on Aug. 2, 2010 now U.S. Pat. No. 8,562,161, U.S. patent application Ser. No. 12/889,719, filed on Sep. 24, 2010, and U.S. patent application Ser. No. 12/975,820, filed on Dec. 22, 2010 now U.S. Pat. No. 9,052,067.

BACKGROUND OF THE INVENTION

1. Field of the Invention

This invention relates to solid state lamps and bulbs and in particular to efficient and reliable light emitting diode (LED) based lamps and bulbs having enhanced color rendering index (CRI) through separation of different phosphor components.

2. Description of the Related Art

Incandescent or filament-based lamps or bulbs are commonly used as light sources for both residential and commercial facilities. However, such lamps are highly inefficient light sources, with as much as 95% of the input energy lost, primarily in the form of heat or infrared energy. Compact Fluorescent Lamps are more effective than incandescent at converting the electricity into light but require the use of toxic materials such as Hg such that when the lamps are disposed of these toxic materials that can pollute the environment, including underground water supplies. One solution for improving the efficiency of lamps or bulbs is to use solid state devices such as light emitting diodes (LED or LEDs), rather than metal filaments, to produce light.

Light emitting diodes generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package 10 illustrated in FIG. 1, a single LED or LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflective cup due to the less than 100% reflectivity of practical reflector surfaces). In addition, heat retention may be an issue for a package such as the package 10 shown in FIG. 1a, since it may be difficult to extract heat through the leads 15A, 15B.

A conventional LED package 20 illustrated in FIG. 2 may be more suited for high power operations which may generate more heat. In the LED package 20, one or more LEDs 22 are mounted onto a carrier such as a printed circuit board (PCB) carrier, substrate or submount 23. A metal reflector 24 mounted on the submount 23 surrounds the LED chip(s) 22 and reflects light emitted by the LEDs 22 away from the package 20. The reflector 24 also provides mechanical protection to the LEDs 22. One or more wire bond connections 27 are made between ohmic contacts on the LED chips 22 and electrical traces 25A, 25B on the submount 23. The mounted LEDs 22 are then covered with an encapsulant 26, which may provide environmental and mechanical protection to the chips while also acting as a lens. The encapsulant 26 can also comprise one or more convention materials (e.g. phosphors) that absorb light from the LED chips and re-emit light with different wavelengths of light. The overall emission from the package 20 can be a combination of light from the LEDs 22 and the re-emitted light from the conversion material. The metal reflector 24 is typically attached to the carrier by means of a solder or epoxy bond.

LEDs, such as those found in the LED package 20 of FIG. 2 can also be coated by conversion material comprising one or more phosphors, with the phosphors absorbing at least some of the LED light. The LED can emit a different wavelength of light such that it emits a combination of light from the LED and the phosphor. The LEDs can be coated with a phosphor using many different methods, with one suitable method being described in U.S. patent applications Ser. Nos. 11/656,759 and 11/899,790, both to Chitnis et al. and both entitled "Wafer Level Phosphor Coating Method and Devices Fabricated Utilizing Method". Alternatively, the LEDs can be coated using other methods such as electrophoretic deposition (EPD), with a suitable EPD method described in U.S. patent application Ser. No. 11/473,089 to Tarsa et al. entitled "Close Loop Electrophoretic Deposition of Semiconductor Devices".

Lamps have also been developed utilizing solid state light sources, such as LEDs, with a conversion material that is separated from or remote to the LEDs. Such arrangements are disclosed in U.S. Pat. No. 6,350,041 to Tarsa et al., entitled "High Output Radial Dispersing Lamp Using a Solid State Light Source." The lamps described in this patent can comprise a solid state light source that transmits light through a separator to a disperser having a phosphor. The disperser can disperse the light in a desired pattern and/or changes its color by converting at least some of the light through a phosphor. In some embodiments the separator spaces the light source a sufficient distance from the disperser such that heat from the light source will not transfer to the disperser when the light source is carrying elevated currents necessary for room illumination. Additional remote phosphor techniques are described in U.S. Pat. No. 7,614,759 to Negley et al., entitled "Lighting Device."

The coated LEDs, LED packages and solid state lamps described above can utilize more than one type of conversion material, such as phosphors, to produce the desired overall emission temperature and CRI. Each of the phosphors can absorb light from the LED and re-emit light at a different wavelength of light. Some of these conventional arrangements can utilize a green/yellow phosphor, in combination with a red phosphor, with these phosphors typically absorbing blue LED light and emitting green/yellow and red light, respectively. The re-emitted light can combine with blue LED light to produce the desired emission characteristics.

These conventional arrangements typically mix the different phosphors together at one location, such as in the LED coating, LED package encapsulant, or lamp remote phosphor. One disadvantage of mixing the phosphors together is that there can be significant "cross-talk" or "overlap" between the emission and excitation spectrum for the different phosphors, which can negatively impact the CRI and emission efficiency for the combined emitted light. FIG. 3 shows graphs 30 showing one example of the emission and excitation characteristics for conventional phosphors that can be mixed together. The first graph 30 shows the red phosphor excitation spectrum 32, green phosphor emission spectrum 34, and the red emission spectrum 36. The second graph 40 shows the same red phosphor emission excitation spectrum 32, yellow phosphor emission spectrum 42, and the same red phosphor emission spectrum 36. The shaded overlap regions 38, 44 show the portion of the green and yellow emission spectrums 34, 42 that overlap the red excitation spectrum 32. This overlap can result in "re-absorption" of the converted yellow/green phosphor light by the red phosphor. This converts a portion of the yellow/green that would otherwise contribute to overall emission, to red. In lighting components using these phosphors to produce a white light combination from the LED and phosphors, the re-absorption distorts the resulting white light on the black body curve of a CIE graph such that the yellow/green peak emission can shift to red, and the red peak can shift to blue. This can result in a CRI reduction in the overall emission. There is also some efficiency loss associated with the phosphor absorption and emission process, and repeating this process through re-absorption of the yellow/green light by the red phosphor results in additional efficiency losses.

SUMMARY OF THE INVENTION

The present invention is directed to LED packages, and LED lamps and bulbs, that are arranged to minimize the CRI and efficiency losses resulting from the overlap of conversion material emission and excitation spectrum. In different devices having conversion materials with this overlap, the present invention arranges the conversion materials to reduce the likelihood that re-emitted light from a first conversion material will encounter the second conversion material to minimize the risk of re-absorption. In some embodiments this risk is minimized by different arrangements where there is separation between the two phosphors.

One embodiment of a solid state lamp according to the present invention comprises an LED and a first conversion material. The lamp further comprises a second conversion material spaced from the first conversion material with light from the LED passing through the second conversion material. The second conversion material wavelength converts and re-emitting at least some of the LED light, with less than 50% of said re-emitted light from the second phosphor passing into said first conversion material.

Another embodiment of a solid state lamp according to the present invention comprises a plurality of LEDs and a red phosphor on at least one of the LEDs. The red phosphor is arranged so that light from it's at least one of the LEDs passing through the red phosphor. The lamp also comprises a yellow or green phosphor separated from and over the LEDs, with light from the LEDs also passing through the yellow or green phosphor.

Still another embodiment of a solid state lamp according to the present invention comprises an LED having a first phosphor coating where the first phosphor absorbs some of the light emitted from the LED and re-emitting a different wavelength of light. The lamp also comprises a second phosphor spaced from the first phosphor with light from the LED passing through the second phosphor. At least some of the LED light is absorbed by the second phosphor and re-emitted at a respective different wavelength of light. The emission spectrum of the light re-emitted from the second phosphor overlaps the excitation spectrum of the first phosphor, and wherein the majority of light from the second phosphor does not encounter the first phosphor.

These and other aspects and advantages of the invention will become apparent from the following detailed description and the accompanying drawings which illustrate by way of example the features of the invention.

BRIEF DESCRIPTION OF THE DRAWINGS

FIG. 1 shows a sectional view of one embodiment of a prior art LED lamp;

FIG. 2 shows a sectional view of another embodiment of a prior art LED lamp;

FIG. 3 is a graph showing overlap between the excitation spectrum and emission spectrum of two phosphors;

FIG. 20 is an exploded view of the lamp shown in FIG. 19;

FIG. 21 is an exploded view of another embodiment of a lamp according to the present invention;

DETAILED DESCRIPTION OF THE INVENTION

Figure 4:
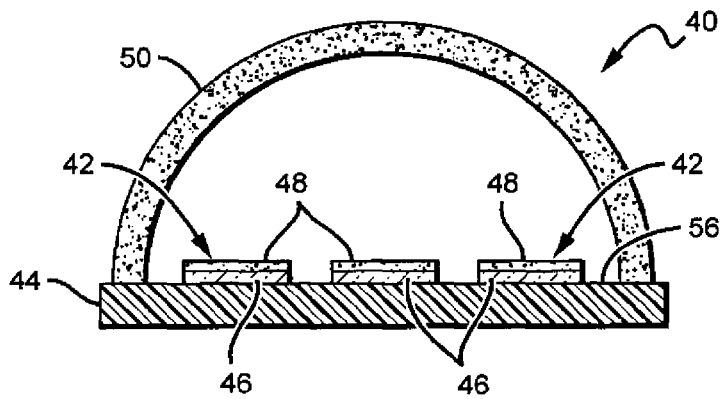
FIG. 4 is a sectional view of one embodiment of a lamp according to the present invention.

The present invention is directed to different embodiments of solid state lamps, bulbs and LED packages utilizing multiple conversion materials to produce the desired overall emission characteristics, with the conversion materials separated to reduce the impact of emission and excitation spectrum overlap. Some embodiments of the present invention are directed to solid state lamps arranged to produce white light with a warm color temperature by utilizing two separate phosphor components in a way that eliminates or reduces the re-absorption (interaction) between the two component phosphors. This can result in emission of warm white light with a CRI that is significantly higher than those arrangements where re-absorption is not addressed, such as where the different phosphors are mixed.

The re-absorption is minimized by providing physical separation between the two phosphors to minimize interaction or crosstalk between the two. That is, the separation reduces the amount of light from the first phosphor that interacts with the second phosphor, to reduce or eliminate the re-absorption by the second phosphor. This in turn reduces the color shift in CRI that may be experienced by this re-absorption.

In some embodiments, the first phosphor can re-emit a wavelength of light that does not overlap with the excitation spectrum of the second phosphor such that light re-emitted from the first phosphor passes through the second phosphor without risk of being absorbed by the second phosphor. The emission spectrum of the second phosphor, however, may emit light that at least partially overlaps with the excitation spectrum of the first phosphor. In arrangements where light from the second phosphor passes through the first phosphor, there may be a risk of light from the second phosphor being re-absorbed by the first phosphor. The separation of the phosphors minimizes the amount of re-emitted light that encounters the first phosphor, thereby minimizing the amount of light that can be re-absorbed by the first phosphor. To allow light from the first phosphor to pass through the second phosphor, in some embodiments can comprise materials such that the emission spectrum of the first phosphor does not overlap the excitation spectrum of the second phosphor.

In some embodiments, the second phosphor can comprise a yellow/green phosphor that absorbs blue light and re-emits yellow/green light, and the first phosphor can comprise a red phosphor that absorbs blue light and emits red light, with the emission spectrum of the yellow/green phosphor overlapping the excitation spectrum of the red phosphor. These embodiments provide separation between the first and second phosphors in a way that minimizes the chances that the yellow/green phosphor emission would encounter the red phosphor, and as a result, there is little chance of re-emitted yellow/green light being reabsorbed by the red phosphor. Compared to the mixed phosphor arrangement, the phosphor separation results in overall lamp or package emission having a higher CRI and higher phosphor efficiency.

The separation can take many different forms that can provide different reductions in crosstalk between the first and second phosphors. In some embodiments the separation can comprise separate layers on an LED chip, with each layer being a different one of the phosphors. The separate layers can be one on top of the other, or can comprise side by side layers on the LED. While this arrangement reduces the amount of crosstalk between the phosphors compared to the mixed embodiment, a certain level of crosstalk remains because of the proximity of the two phosphors.

In other embodiments, one of the phosphors can be provided remote to the other phosphor, and this can take many different forms. In some embodiments, one of the phosphors can comprise a conformal coat over one or more LEDs and the second phosphor can be remote to the first phosphor, such as in the shape of dome over the LEDs. This arrangement reduces even further the chances of crosstalk between the first and second phosphors by further reducing the chances that light emitted from the second phosphor would encounter the first phosphor.

In still other embodiments, the likelihood of crosstalk can be reduced further by arranging the first phosphor over an LED, such as in an LED package, and arranging the second phosphor over an LED in its own package. The packages can be arranged in relation to one another such that the light remitted from the first phosphor in the first package does not emit onto the second package, such that there is no opportunity for crosstalk between the two. In some embodiments, the emitters can be arranged adjacent to one another so that their emission combines as overall lamp light, but in a way such that they do not illuminate one another. There are many other arrangements that can provide these different levels of separation between the phosphors.

There are other advantages that can be provided by the present invention including but not limited to cost saving. For separation where one of the phosphors is conformal coated on the LED, less phosphor is typically used in the conformal coat. As a result, the more expensive of the phosphors can be used for the conformal coat. For example, established yellow phosphors like YAG:$Ce^{3+}$ have very low cost, but by contrast red phosphors, such as typical Eu doped red phosphors, can be much more expensive. By applying the red phosphor as a conformal coating, it reduces the amount of the more expensive phosphor needed for each system, with the resulting cost savings.

Another advantage of this arrangement is that having at least one of the phosphors remote can lead to higher phosphor efficiency compared to lamps with all the phosphors on the LED chips. One way that the efficiency is enhanced is through the optical cavity effect created in the space between the emitters and the remote phosphor. With remote phosphor configurations there can also be more flexibility in designing a highly reflective cavity than in embodiment having phosphor coatings on the chip. There can also be a thermal benefit in having a remote phosphor. The remote phosphor can be thermally isolated from the chip heating resulting in less thermal quenching of the phosphor material. The third benefit is less optical quenching of the phosphor material. For some phosphors, their quantum efficiency drops with higher light flux density passing through the phosphor materials. By having a remote phosphor, the flux density passing through the phosphor can be reduced, thereby reducing optical quenching. The reduction in thermal and optical quenching can lead to more stable light output over time, even at high operating temperatures.

The present invention is described herein with reference to certain embodiments, but it is understood that the invention can be embodied in many different forms and should not be construed as limited to the embodiments set forth herein. In particular, the present invention is described below in regards to certain LED packages or lamps having one or multiple LEDs or LED chips or LED packages in different configurations, but it is understood that the present invention can be used for many other lamps having many different configurations. Examples of different lamps arranged in different ways according to the present invention are described below and in U.S. Provisional Patent application Ser. No. 61/435,759, to Le et al., entitled "Solid State Lamp", filed on Jan. 24, 2011, and incorporated herein by reference.

Different embodiments of the lamps can have many different shapes and sizes, with some embodiments having dimensions to fit into standard size envelopes, such as the A19 size envelope. This makes the lamps particularly useful as replacements for conventional incandescent and fluorescent lamps or bulbs, with lamps according to the present invention experiencing the reduced energy consumption and long life provided from their solid state light sources. The lamps according to the present invention can also fit other types of standard size profiles including but not limited to A21 and A23.

The embodiments below are described with reference to LED of LEDs, but it is understood that this is meant to encompass LED chips and LED packages. The components can have different shapes and sizes beyond those shown and different numbers of LEDs can be included.

The present invention is described herein with reference to conversion materials, phosphors, phosphor layers and related terms. The use of these terms should not be construed as limiting. It is understood that the use of the term phosphor or phosphor layers is meant to encompass and be equally applicable to all wavelength conversion materials.

It is also understood that the lamp's light source may be comprised of one or multiple LEDs, LED chips or LED packages, and in embodiments with more than one, the LEDs, LED chips or LED packages may have different emission wavelengths. Although the present invention is described below with reference to phosphor conversion materials, it is understood that many other conversion materials can be used. The present invention is described herein with reference to conversion materials, phosphor layers being remote to one another. Remote in this context refers being spaced apart from and/or to not being on or in direct thermal contact. The present invention is also described with reference to LED chips, but it is understood that this can encompass LEDs and LED packages.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

The phosphors are described herein with referenced to red emitting phosphors, but it is understood that this can include other colors close to red in the light spectrum, such as orange. The phosphors are also described as being yellow emitting, but this can also comprise green emitting phosphors.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

FIG. 4 shows one embodiment of a lamp 40 according to the present invention comprising a plurality of LED chips 42 mounted onto a carrier 44 that can comprise a printed circuit board (PCB) carrier, substrate or submount. The carrier 44 can comprise interconnecting electrical traces (not shown) for applying an electrical signal to the LED chips 42. Each of the LEDs chips 42 can comprise an LED 46 with a conformal coat of first phosphor material 48 on the LED 46. Many different commercially available LEDs can be utilized emitting many different colors of light, and many different phosphor materials can be used such as one of those listed below. In some embodiments, the LED can comprise a conventional blue emitting LED, and the conversion material can comprise a red phosphor that absorbs at least some of the blue light from the LED and re-emits red light. In the embodiment shown, the red phosphor is arranged to convert only a portion of the blue light from the LED chip such that the LED chips emit both blue and red light. By allowing a portion of the blue light to pass through the red phosphor, the LED chips 42 do not need to operate with the red phosphor in saturation. This can allow for the LED chips 42 to operate with higher emission efficiency. In other embodiments, the red phosphor can be arranged to operate in saturation by converting essentially all of the blue light to red, such that the LED chips emit substantially red light.

A second phosphor 50 is included over and spaced apart from the LED chips 42, so that at least some of the light from the LED chips 42 passes through the second phosphor 50. The second phosphor 50 should be of the type that absorbs the wavelength of light from the LED chips 42 and re-emits a different wavelength of light. In the embodiments shown, the second phosphor is in a dome shape over the LED chips, but it is understood that the second phosphor can take many different shapes and sizes such as disks or globes. The second phosphor can be in the form of a phosphor carrier characterized as comprising a conversion material in a binder, but can also comprise a carrier that is thermally conductive and a light transmitting material. Phosphors arranged with thermally conductive materials are described in U.S. Provisional Patent Application No. 61/339,516, filed on Mar. 3, 2010 and titled "LED Lamp Incorporating Remote Phosphor With Heat Dissipation Features", which is incorporated herein by reference. With the second phosphor formed in a dome, an open space is formed between the LED chips 42 and the second phosphor 50.

In other embodiments, an encapsulant can be formed or mounted over the LED chips 42 and the second phosphor 50 can be formed or deposited as a layer on the top surface of the encapsulant. The encapsulant can take many different shapes, and in the embodiment shown is dome-shaped. In still other embodiments having an encapsulant, the second phosphor 50 can be formed within the encapsulant as a layer, or in regions of the encapsulant.

Many different phosphors can be used in different embodiments according to the present invention with the second phosphor in the embodiment shown comprising a phosphor that absorbs blue light from the LED chips and emits yellow light. Many different phosphors can be used for the yellow conversion material including commercially available YAG: Ce phosphors. As discussed above, a portion of the blue light from the LED chips passes through the first (red) phosphor without being converted. The blue and red light from the LED chips 42 pass through the second phosphor where a portion of the blue light is converted to yellow. A portion of the blue light can also pass through the second phosphor with the red light from the LED chips 42. As a result, the lamp emits light that is a combination of blue, red and yellow light, with some embodiments emitting a warm white light combination with the desired color temperature.

The blue light from the LED chips 42 can also be converted by many other phosphors that provide a full range of broad yellow spectral emission. Beyond the YAG:Ce mentioned above, these conversion materials can be made of phosphors based on the $(Gd,Y)_3(Al,Ga)_5O_{12}$:Ce system. Other yellow phosphors that can be used for creating white light when used with a blue emitting LED based emitters include but not limited to:

$Tb_{3-x}RE_xO_{12}$:Ce (TAG);
RE=Y, Gd, La, Lu; and
$Sr_{2-x-y}Ba_xCa_ySiO_4$:Eu.

The second phosphor 50 can also be arranged with more than one yellow or green emitting phosphor either mixed together or the second phosphor can comprise more than one layer of yellow or green emitting phosphor.

The first phosphor 48 on the LED chips 42 can comprise many different commercially available phosphors, such as Eu doped red phosphors that can absorb blue light from the LED chip and red light. Other red emitting phosphors that can be used including:

$Sr_xCa_{1-x}$S:Eu,Y; Y=halide;
$CaSiAlN_3$:Eu; or
$Sr_{2-y}Ca_ySiO_4$:Eu

Different sized phosphor particles can be used including but not limited to particles in the range of 10 nanometers (nm) to 30 micrometers (μm), or larger. Smaller particle sizes typically scatter and mix colors better than larger sized particles to provide a more uniform light. Larger particles are typically more efficient at converting light compared to smaller particles, but emit a less uniform light. In some embodiments, the first and/or second phosphor can be provided in a binder, and the phosphor can also have different concentrations or loading of phosphor materials in the binder. A typical concentration is in a range of 30-70% particle concentration by weight. In one embodiment, the phosphor concentration for the first and second phosphors is approximately 65% by weight, and is preferably uniformly dispersed. The first and second phosphors can also be formed in layers having different regions with different conversion materials and different concentrations of conversion material.

When the phosphors are provided in a binder, different materials can be used, with materials preferably being robust after curing and substantially transparent in the visible wavelength spectrum. Suitable materials include silicones, epoxies, glass, inorganic glass, dielectrics, BCB, polymides, polymers and hybrids thereof, with the preferred material being silicone because of its high transparency and reliability in high power LEDs. Suitable phenyl- and methyl-based silicones are commercially available from Dow® Chemical. The binder can be cured using many different curing methods depending on different factors such as the type of binder used. Different curing methods include but are not limited to heat, ultraviolet (UV), infrared (IR) or air curing.

The first and second phosphors 48, 50 can be applied using different processes including but not limited to spin coating, sputtering, printing, powder coating, electrophoretic deposition (EPD), and electrostatic deposition, among others. Various deposition methods and systems are described in U.S. Patent Application Publication No. 2010/0155763, to Donofrio et al., titled "Systems and Methods for Application of Optical Materials to Optical Elements," and also assigned to Cree, Inc. and incorporated herein in its entirety. As mentioned above, the phosphor layer 48 can be applied along with a binder material, but it is understood that a binder is not required. In still other embodiments, the second phosphor can be fabricated separately in a dome and then mounted to the carrier 44 and over the LED chips 42.

The lamp can also be used in conjunction with a diffuser as described in U.S. Provisional Patent Application No. 61/339, 515, titled "LED Lamp With Remote Phosphor and Diffuser Configuration," which is incorporated herein by reference. This application also describes many different shapes and sizes for the second phosphor or phosphor carrier that can also be used in the in embodiments of the invention described herein.

Alternatively, scattering materials can be used in conjunction with the phosphors, with one such scattering material comprising scattering particles. The scattering particles can also be included in a binder material that can be the same as those described above in reference to the binder used with the first and second phosphors. The scattering particles can be provided in different concentrations depending on the application and materials used. A suitable range for scattering particle concentration is from 0.01% to 0.2%, but it is understood that the concentration can be higher or lower. In some embodiments the concentration can be as low as 0.001%. It is also understood that the scattering particles can be in different concentrations in different regions. For some scattering particles there can be an increase in loss due to absorption for higher concentrations. Thus, the concentrations of the scattering particles can be chosen in order to maintain an acceptable loss figure, while at the same time dispersing the light to provide the desired emission pattern.

The scattering particles can comprise many different materials including but not limited to:
silica;
kaolin;
zinc oxide (ZnO);
yttrium oxide ($Y_2O_3$);
titanium dioxide ($TiO_2$);
barium sulfate ($BaSO_4$);
alumina ($Al_2O_3$);
fused silica ($SiO_2$);
fumed silica ($SiO_2$);
aluminum nitride;
glass beads;
zirconium dioxide ($ZrO_2$);
silicon carbide (SiC);
tantalum oxide ($TaO_5$);
silicon nitride ($Si_3N_4$);
niobium oxide ($Nb_2O_5$);
boron nitride (BN); or
phosphor particles (e.g., YAG:Ce, BOSE)

More than one scattering material in various combinations of materials or combinations of different forms of the same material may be used to achieve a particular scattering effect. The scattering particles can be in many different locations in the lamp.

The lamp 40 can also comprise a reflective material/layer 56 on the surfaces of the carrier 44 not covered by the LED chips 42. The reflective layer 56 allows for lamp 40 to efficiently recycle photons, and increase the emission efficiency of the lamp. Light that emits back toward the carrier is reflected by the reflective material/layer 56 such that absorption is reduced and the light can contribute to useful emission from the lamp. It is understood that the reflective layer 56 can comprise many different materials and structures including but not limited to reflective metals or multiple layer reflective structures such as distributed Bragg reflectors. It is also understood that the surfaces of the LEDs, as well as the first and second phosphors can be shaped or textures to enhance light extraction.

During operation, an electrical signal is applied to the lamp 40 causing the LEDs within the LED chips 42 to emit blue light that passes through the first phosphor 48. A portion of the blue LED light is absorbed by the red phosphor 48 and is re-emitted as red light. A potion of the blue light also passes through the red first phosphor 48 without being converted, such that the LED chips 42 emit both red and blue light. Light from the LED chips 42 is emitted through the second phosphor 50 where at least a portion of the blue light from the LED light is converted to yellow light, and in some embodiments a portion of the light from the LED chips 42 passes through the second phosphor 50 without being converted. As mentioned above, this allows the lamp to emit a white light combination of blue, red and yellow light.

When the blue component of the light from the LED chips is absorbed by the second phosphor 50 it is re-emitted in all directions. In the embodiment shown, as the phosphor particles absorb the blue light the yellow light is re-emitted forward and out of the lamp, and back toward the LED chips. The light that is emitted back toward the LED chips 42 can encounter the first phosphor 48 on the LED chips 42. As mentioned above, the excitation spectrum of many red phosphors overlaps the emission spectrum of many yellow/green phosphors, so light from the second phosphor that is emitted back toward the LED chips 42, risks being absorbed by the first phosphor. This absorbed yellow light can be re-emitted as red light, which can result in a color shift for the overall lamp emission. By spacing the second phosphor 50 as shown in lamp 40 (instead of mixing the phosphors), the chances that second phosphor light would encounter the first phosphor is greatly reduced. Most emission paths of yellow light from the second phosphor 50 would not encounter the first phosphor and would not risk re-absorption. Much of the light emitted back toward the LED chips 42 is reflected off the reflective layer on the carrier 44 such that it can contribute to useful emission from the lamp.

In some embodiments, the second phosphor is spaced from the first so that less than 50% of the re-emitted light second phosphor encounters or passes into the first phosphor, while in other embodiments less than 40% encounter or passes into the first phosphor. In still other embodiments, less than 25% of the second phosphor light encounters the first phosphor, while in other embodiments less than 10% encounter the first phosphor.

Figure 5:
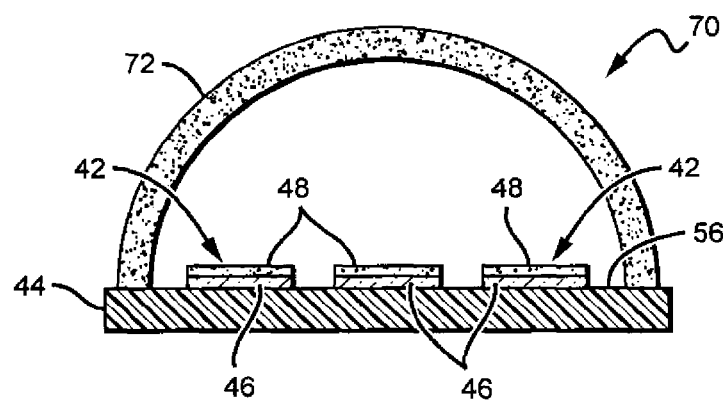
FIG. 5 is a sectional view of another embodiment of a lamp according to the present invention.

Different lamps according to the present invention can be arranged in many different ways with many different features and materials. FIG. 5 shows another embodiment of a lamp 70 according to the present invention having many similar features and components as lamp 40 shown in FIG. 4 and described above, and operates in much the same way. For similar features and components the same reference numbers are used with the understanding that the description of lamp 40 applies equally to this embodiment or other embodiments below using the same reference numbers.

The lamp 70 includes LED chips 42 each of which is mounted on a carrier 44, with each of the LED chips 42 comprising a blue emitting LED coated by a red first phosphor 48. The uncovered surfaces of the carrier 44 can also comprise a reflective layer 56. The lamp 70 includes a second phosphor 72 over the LED chips that is arranged in much the same way as second phosphor 50 described above. In this embodiment, however, the second phosphor 50 comprises a phosphor material that absorbs blue light and re-emits green light. For example, the following phosphors can be used to generate green light:

$SrGa_2S_4$:Eu;
$Sr_{2-y}Ba_ySiO_4$:Eu;
$SrSi_2O_2N_2$:Eu;
$Lu_3Al_5O_{12}$ doped with $Ce^{3+}$;
(Ca, Sr, Ba) $Si_2O_2N_2$ doped with $Eu^{2+}$;
$CaSc2O4:Ce^{3+}$; and
(Sr, Ba) $2SiO4:Eu^{2+}$.

The lamp 70 operates in much the same way as lamp 40, but emits a combination of blue, red and green light. In some embodiments this combination can produce a lamp emission that is a warm white light with the desired temperature.

Figure 6:
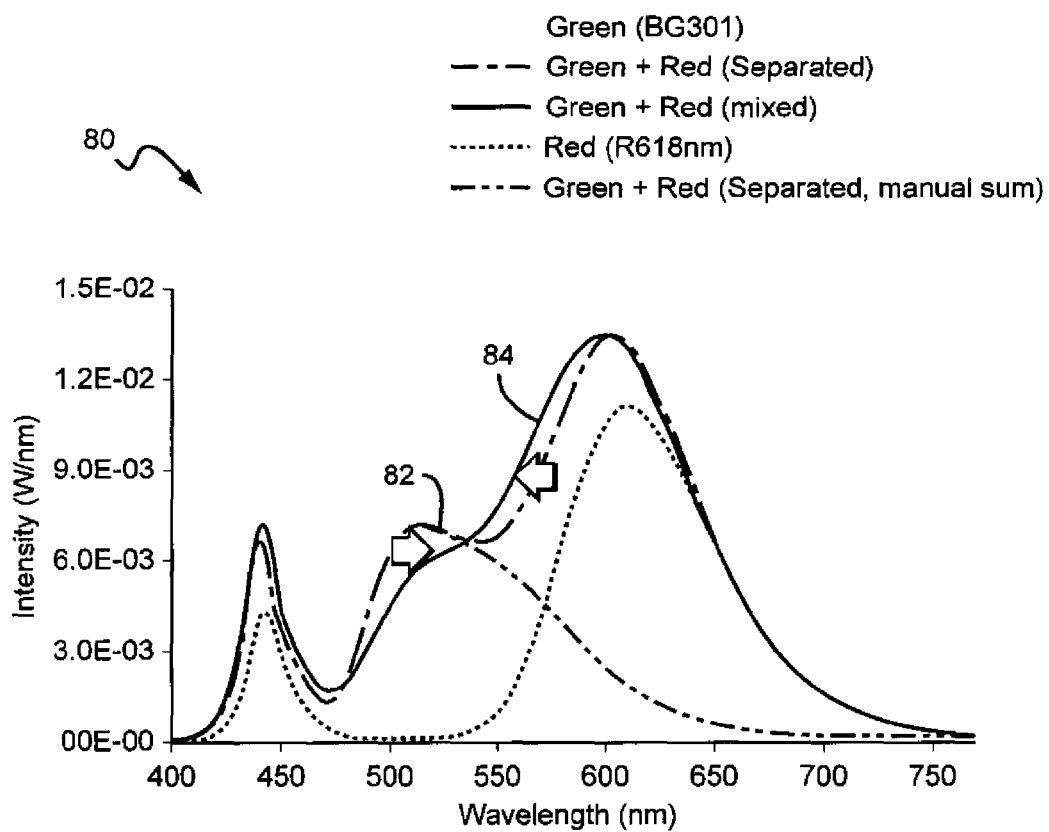
FIG. 6 s a graph showing the emission spectrum for different lamps according to the present invention.

Beyond those listed above, the following lists some additional suitable phosphors that can be used as the first or second phosphors. Each exhibits excitation in the blue and/or UV emission spectrum, provides a desirable peak emission, has efficient light conversion, and has acceptable Stokes shift:

Yellow/Green
(Sr, Ca, Ba) (Al, Ga)$_2S_4$:Eu$^{2+}$
$Ba_2$(Mg, Zn) $Si_2O_7$: $Eu^{2+}$
$Gd_{0.46}Sr_{0.31}Al_{1.23}O_xF_{1.38}$: $Eu^{2+}{}_{0.06}$
$(Ba_{1-x-y}Sr_xCa_y) SiO_4$:Eu
$Ba_2SiO_4$:$Eu^{2+}$ Red
$Lu_2O_3$:$Eu^{3+}$
$(Sr_{2-x}La_x) (Ce_{1-x}Eu_x) O_4$
$Sr_2Ce_{1-x}Eu_xO_4$
$Sr_{2-x}Eu_xCeO_4$
$SrTiO_3$:$Pr^{3+}$, $Ga^{3+}$
$CaAlSiN_3$:$Eu^{2+}$
$Sr_2Si_5N_8$:$Eu^{2+}$ FIG. 6 is a graph 80 showing a comparison of the emission characteristics for a lamp with mixed phosphor compared to a similar lamp with separate phosphors as described above. The first emission spectrum 82 is for a lamp with separated red and green phosphors, with the spectrum showing peaks in the blue, green and red wavelength spectrums. The second emission spectrum 84 is for a similar lamp with mixed red and green phosphors and shows a reduction and shift in the blue peak compared to the separated spectrum 82, as well as a shift in the red peak. The overall phosphor conversion efficiency for both is approximately the same (42.5% for separated vs. 46.1% for mixed), but the CRI for the separated is approximately 88.5 for separated phosphors verses 78.5 for the mixed phosphor configuration.

Figure 7:
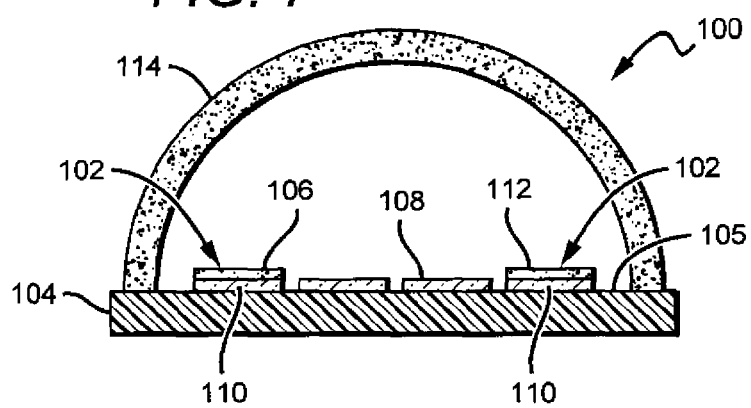
FIG. 7 is a sectional view of another embodiment of a lamp according to the present invention.

FIG. 7 shows still another embodiment of a lamp 100 according to the present invention comprising a combination of different LED chips emitting different colors of light to generate the desired lamp emission. The lamp 100 comprises LED chips 102 mounted on a carrier 104, with the carrier being similar to carrier 44 described above. The carrier can have a reflective layer 105 covering its surface between the LED chips 102. The LED chips 102 can comprise red emitting LED chips 106 and blue emitting LED chips 108 that together can produce the desired red and blue light components of the lamp emission. The red LED chips 106 can comprise an LED 110 coated by a red phosphor 112 as described above, with some embodiments of the LEDs 110 emitting blue light and the red phosphor 112 absorbing at least some of the blue light and re-emitting red light. In some embodiments the red phosphor 112 can be arranged to absorb substantially all of the blue LED light, while in other embodiments the red phosphor 112 can be arranged to absorb only a portion of the blue light.

Similar to the embodiments above, a second phosphor 114 is included over and spaced apart from the LED chips 102, with the second phosphor comprising a phosphor that absorbs blue light and re-emits yellow light. During operation red and blue light from the LED chips passes through a second phosphor where some of the blue light is converted to yellow. The lamp 100 emits a white light combination of blue, red and yellow. As described above, the separation between the red and yellow phosphors minimizes the risk that the red phosphor will re-absorb the yellow light from the second phosphor.

Figure 8:
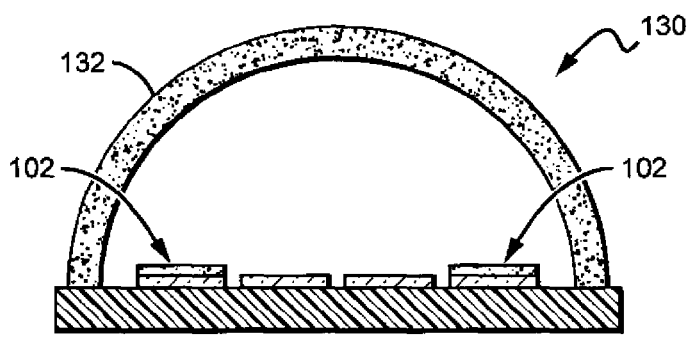
FIG. 8 is a sectional view of another embodiment of a lamp according to the present invention.

FIG. 8 shows another lamp 130 according to the present invention that is similar to lamp 100. Instead of having a yellow emitting second phosphor, lamp 130 has a green emitting second phosphor 132 that absorbs some of the blue light from its LED chips 102 such that the lamp emits a white light combination of blue, red and green.

Figure 9:
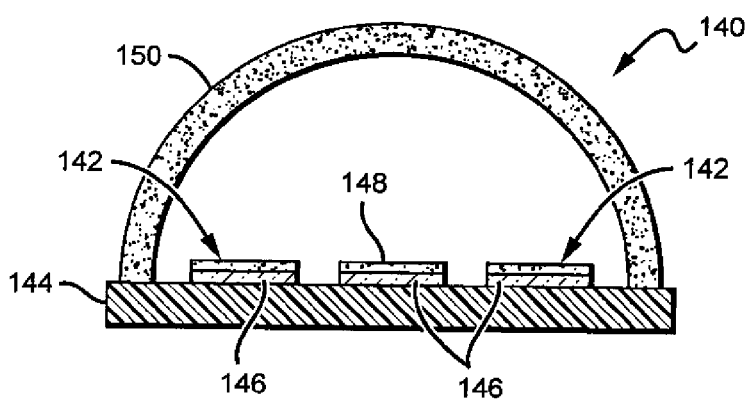
FIG. 9 is a sectional view of another embodiment of a lamp according to the present invention.

As mentioned above, the lamps according to the present invention can be arranged in many different ways with many different phosphor materials. FIG. 9 shows another embodiment of lamp 140 according to the present invention comprising LED chips 142 mounted to a carrier 144 as described above. In this embodiment, however, the LED chips comprise blue emitting LEDs 146 with a conformal coat of a yellow first phosphor 148. The first phosphor 148 absorbs at least some of the light from the LED 146 and re-emit a yellow light. The second phosphor 150 is in the form of dome over the LED chips 142 and comprises a red phosphor. Blue (and yellow) light from the LED chips 142 passes through the second phosphor 150 where at least some of the blue LED light is absorbed by the second phosphor on re-emitted as red light. The lamp 140 emits a white light combination of blue, yellow and red.

Figure 10:
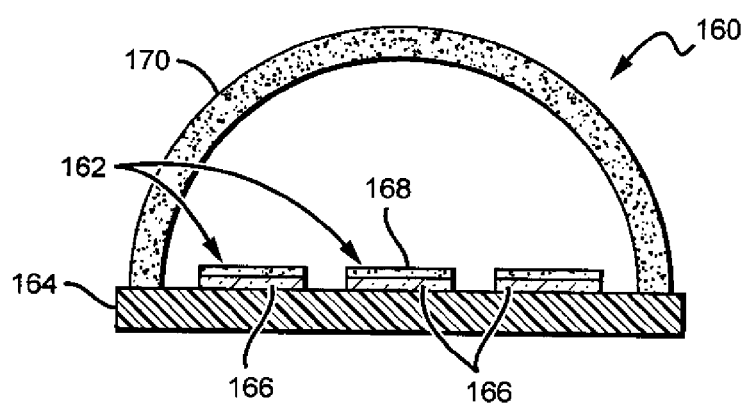
FIG. 10 is a sectional view of another embodiment of a lamp according to the present invention.

FIG. 10 shows still another embodiment of a lamp 160 according to the present invention having LED chips 162 mounted on a carrier 164, with each of the LED chips 162 comprising an LED 166 and a conformal coat of a green first phosphor 168. At least some blue light from each of the LEDs 166 passes through the first phosphor 168 and is converted to green light, such that each of the LED chips 162 emits green and blue light. The blue (and green) LED light passes through a second dome shaped second red phosphor 170. At least some of the LED light is converted to red at the second phosphor with the lamp 160 emitting a white light combination of blue, red and green light.

Figure 11:
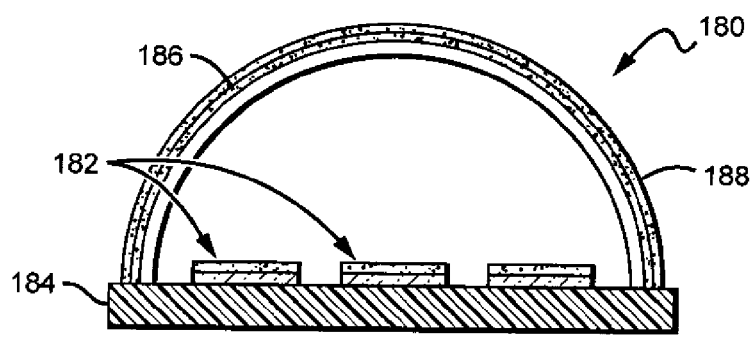
FIG. 11 is a sectional view of another embodiment of a lamp according to the present invention.

FIG. 11 shows still another embodiment of a lamp 180 according to the present invention comprising blue emitting LED chips 182 mounted to a carrier 184. Instead of being conformal coated on the LED chips 182, a first red phosphor 186 is provided in a dome over the LED chips 182, with light from the LED chips 182 passing through the first phosphor 186 where at least some of it is converted to red light. A second green phosphor 188 is included in a dome over the first phosphor 186 with red light from the first phosphor 186 and the blue light from the LED chips 182 passing through the second phosphor 188 where at least some of the light is converted to green light. The lamp emits a white light combination of blue, red and green light. The second phosphor 188 is shown on the first phosphor 186, but it is understood that there can be a space between the first and second phosphors 186,188 and that the phosphors can be provided in different order, such as having the green phosphor on the inside and the red phosphor on the outside.

Figure 12:
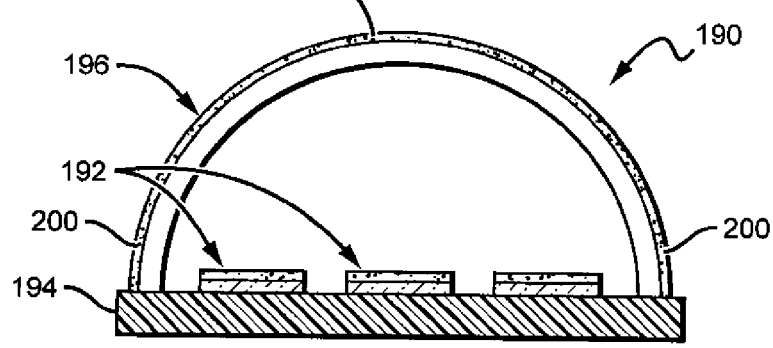
FIG. 12 is a sectional view of another embodiment of a lamp according to the present invention.

FIG. 12 shows another embodiment of a lamp 190 according to the present invention having blue emitting LED chips 192 on a carrier 194. The lamp includes red and green phosphors, with the phosphor shown being in different regions of a phosphor dome 196. In the embodiment shown, the red first phosphor 198 is on the top portion of the dome, and the green second phosphor 200 is on the lower portions of the dome 196. Blue light from the LED chips passes through the first and second phosphors portions 198, 200 where at least some LED light is converted to red and green light, respectively. The lamp emits a white light combination of blue, red and green light. It is understood that other embodiments can comprise different regions of phosphors arranged in different ways. Each of the lamps shown in FIGS. 9-12 can comprise reflective layers on the carrier as described above.

Figure 13:
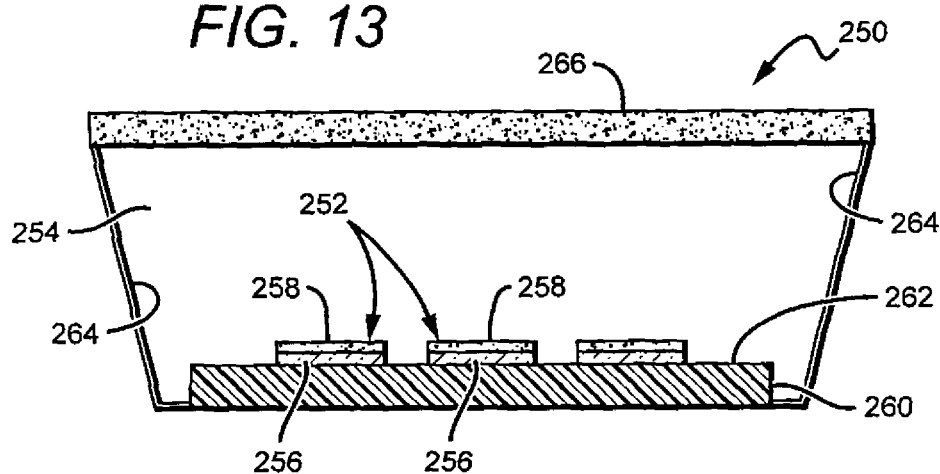
FIG. 13 is a sectional view of one embodiment of a lamp according to the present invention comprising an optical cavity.

As mentioned above, the lamps and their phosphors can be arranged in many different ways according to the present invention. FIG. 13 shows still another embodiment of a lamp 250 having its LED chips 252 mounted within an optical cavity 254. Like the embodiments above, the LED chips 252 can comprise an LED 256 coated by a first phosphor 258, and in some embodiments of the LED 256 emits blue light and the first phosphor is a red phosphor absorbing at least some of the blue LED light and re-emitting red light. In this embodiment, the red phosphor absorbs only a portion of the blue light from the LED, such that the LED chips 252 emit red and blue light.

The LED chips 252 can be mounted to a carrier 260 similar to the carriers described above, and in the embodiment shown the LED chips 252 and the carrier 260 can be mounted within the optical cavity 254. In other embodiments an optical cavity can be mounted to the carrier around the LED chips. The carrier 260 can have a reflective layer 262 on its exposed surface between the LED chips 252 as described above, and the optical cavity 254 can have reflective surfaces 264 to redirect light out the top opening of the optical cavity 254.

As second phosphor 266 is arranged over the opening of the optical cavity 254, and in the embodiment shown is in a planar shape. It is understood, however, that the second phosphor can take many different shapes, including but not limited to a dome or a globe. Similar to the embodiments above, the second phosphor 266 can comprise a phosphor that absorbs light from the LED chips 252 and emits a different color of light. In the embodiment shown, the second phosphor 266 comprises one of the yellow phosphors described above that absorbs blue light and re-emits yellow light. Like the embodiments above, blue and red light from the LED chips 252 passes through the second phosphor 266 where at least some of the blue light is absorbed by the yellow phosphor and re-emitted as yellow light. The lamp 250 can emit a white light combination of blue, red and yellow light.

The separation between the LED chips 252 and the second phosphor 266 greatly reduces the change that yellow light from the second phosphor 266 would pass into the red first phosphor 258. Like the embodiments above, this reduces the likelihood that yellow light would be absorbed by the red first phosphor and be re-emitted as red light.

Figure 14:
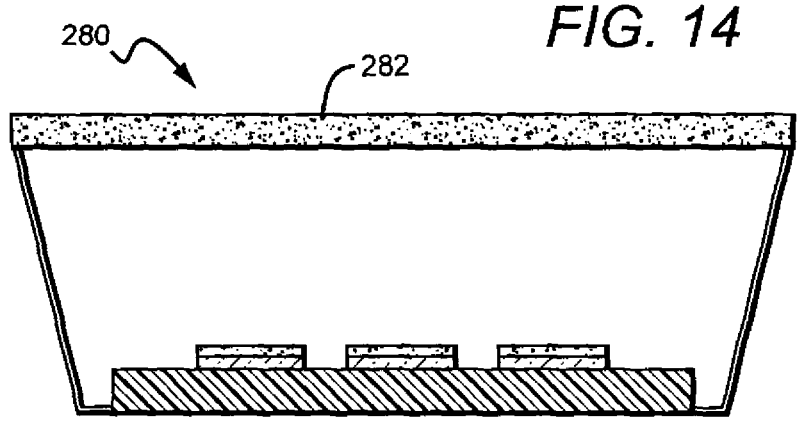
FIG. 14 is a sectional view of another embodiment of a lamp according to the present invention also comprising an optical cavity.

FIG. 14 shows another embodiment of a lamp 280 according to the present invention, having many of the same features as the lamp 250. In this embodiment, however, the second phosphor 282 comprises a green emitting phosphor that absorbs some of the blue light from the LED chips and re-emits green light. In operation the lamp 280 emits a white light combination of blue and red light from the LED chips and green light from the second phosphor, with the separation between the first phosphor resulting in minimal re-absorption of green light by the first phosphor.

Figure 15:
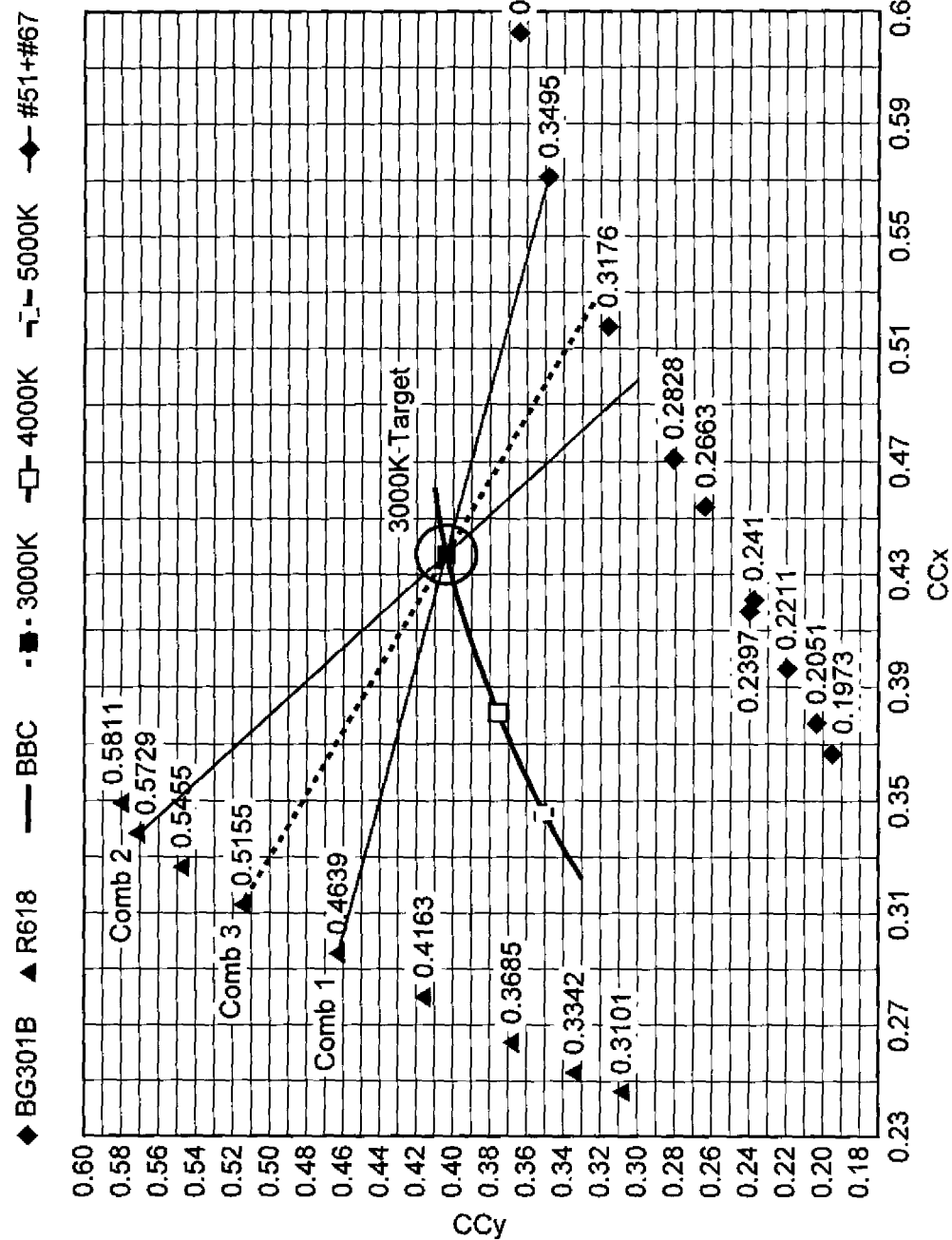
FIG. 15 is a CIE diagram showing different lighting combinations.

Different embodiments can combine different lighting concentrations of lighting components to achieve the desired target color and temperature. FIG. 15 is a CIE diagram 290 showing different combinations of green and red lighting components that combine on the black body curve at approximately 3000 k. Combination 1 (Comb 1) has lowest green component in its emission spectrum and as a result the spectrum needs a larger red portion to achieve the desired color and temperature. Combination 2 (Comb 2) has the largest green component and as a result the lowest red component, while combination 3 (Comb 3) has a mid-point red and green component.

Figure 16:
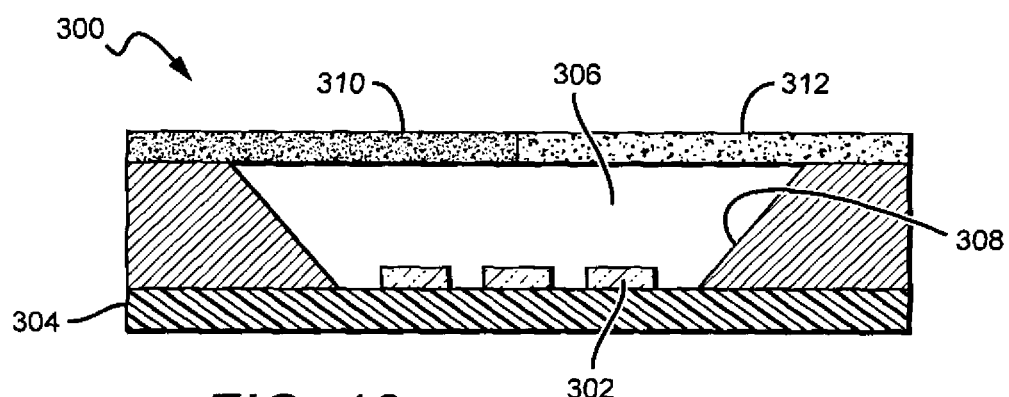
FIG. 16 is a sectional view of another embodiment of a lamp according to the present invention also comprising an optical cavity.

FIG. 16 shows another embodiment of a lamp 300 according to the present invention having blue LED chips 302 mounted to a carrier 304, with the LED chips 302 arranged within an optical cavity 306 having reflective surfaces 308. The first and second phosphor 310 and 312 are provided in a planar shape of the opening of the optical cavity 306, but are arranged adjacent to one another, with the first red phosphor 310 covering approximately half of the opening and the second green (or yellow) phosphor 312 covering the remainder of the optical cavity opening. Blue light from the LED chips 302 passes through the phosphors 310 and 312 where a portion of it is converted to red and green light, respectively. The lamp 300 emits a white light combination of blue, red and green light. It is understood that the phosphors can be arranged in many different region arrangements, and can also be provided in layers over one another.

Figure 17:
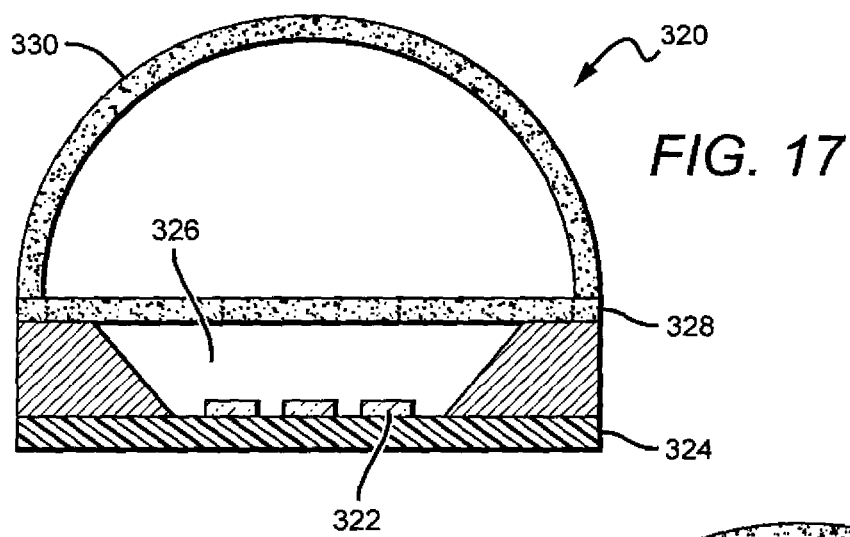
FIG. 17 is a sectional view of another embodiment of a lamp according to the present invention also comprising an optical cavity.

FIG. 17 shows another embodiment of a lamp 320 according to the present invention having blue LED chips 322 mounted to a carrier 324 with the LED chips 322 arranged within an optical cavity 326. A planar red first phosphor 328 is arranged over the opening of the optical cavity 326, and a second green (or yellow) phosphor 330 is arranged in dome over the first phosphor. LED light passes through the first and second phosphors with at least some being converted so that the lamp 320 emits a white light combination of blue, red and green light.

Figure 18:
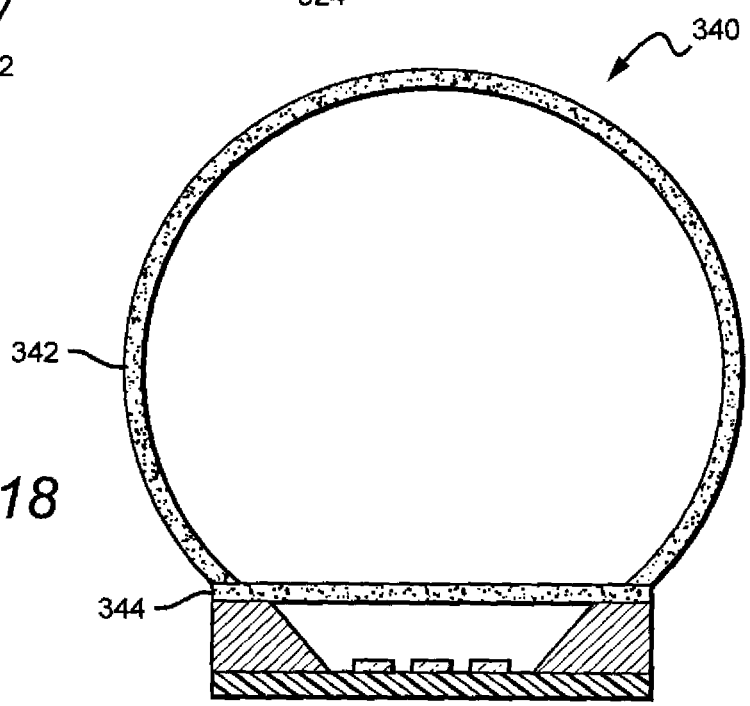
FIG. 18 is a sectional view of another embodiment of a lamp according to the present invention also comprising an optical cavity.

FIG. 18 shows another embodiment of a lamp 340 according to the present invention that is arranged similar to the lamp 320 shown in FIG. 17. In this embodiment, however, the second green phosphor 342 is arranged in a globe over the first phosphor 344, with this globe shape promoting re-emission of the second phosphor light in a more omnidirectional pattern. In particular, it can promote downward emission of light from the second phosphor 342.

Figure 19:
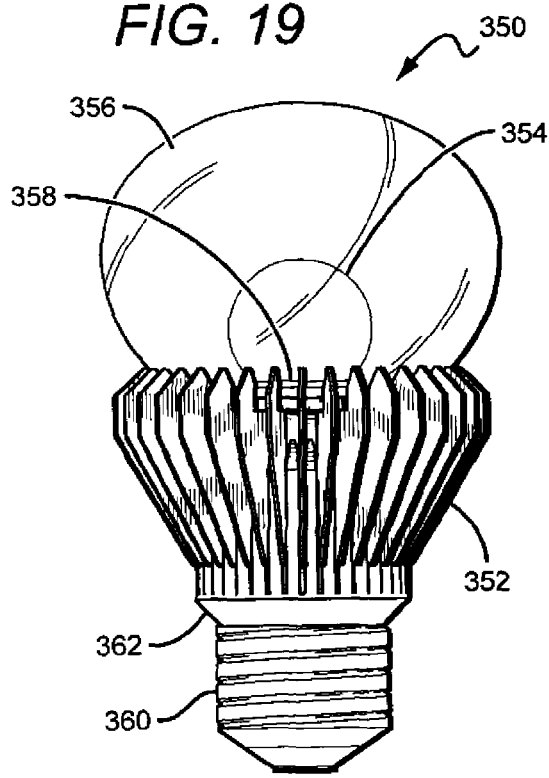
FIG. 19 is an elevation view of another embodiment of a lamp according to the present invention.

FIGS. 19 and 20 show another embodiment of a lamp 350 according to the present invention similar to those shown and described in U.S. Provisional Patent Application Ser. No. 61/339,515, filed on Mar. 3, 2010, and titled "Lamp With Remote Phosphor and Diffuser Configuration." and U.S. patent application Ser. No. 12/901,405, filed on Oct. 8, 2010, and titled "Non-uniform Diffuser to Scatter Light Into Uniform Emission Pattern," The lamp comprises a submount or heat sink 352, with a dome shaped phosphor carrier 354 and dome shaped diffuser 356. It also comprises LEDs 358 that in this embodiment are mounted on a planar surface of the heat sink 352 with the phosphor carrier and diffuser over the LED chips 358. The LED chips 358 and phosphor carrier 354 can comprise any of the arrangements and characteristics described above, such as some embodiments having a first phosphor on the LED chips 358 and second phosphor in the phosphor carrier 354, while others have the first and second phosphors as part of the phosphor carrier 354. The lamp 350 can comprise a mounting mechanism of the type to fit in conventional electrical receptacles. In the embodiment shown, the lamp 350 includes a screw-threaded portion 360 for mounting to a standard Edison socket. Like the embodiments above, the lamp 350 can include standard plug and the electrical receptacle can be a standard outlet, or can comprise a GU24 base unit, or it can be a clip and the electrical receptacle can be a receptacle which receives and retains the clip (e.g., as used in many fluorescent lights).

The lamps according to the present invention can comprise a power supply or power conversion unit that can comprise a driver to allow the bulb to run from an AC line voltage/current and to provide light source dimming capabilities. In some embodiments, the power supply can comprise an offline constant-current LED driver using a non-isolated quasi-resonant flyback topology. The LED driver can fit within the lamp 350, such as in body portion 362, and in some embodiments can comprise a less than 25 cubic centimeter volume, while in other embodiments it can comprise an approximately 20 cubic centimeter volume. In some embodiments the power supply can be non-dimmable but is low cost. It is understood that the power supply used can have different topology or geometry and can be dimmable as well.

The lamp embodiments described herein can be arranged to meet Department of Energy (DOE) Energy Star defined omnidirectional distribution criteria, which are incorporated herein by reference. One requirement of this standard met by the lamp described herein is that the emission uniformity must be within 20% of mean value from 0 to 135° viewing and; >5% of total flux from the lamp must be emitted in the 135-180° emission zone, with the measurements taken at 0, 45, 90° azimuthal angles. The different lamp embodiments described herein can also comprise A-type retrofit LED bulbs that meet the DOE Energy Star standards. The present invention provides lamps that are efficient, reliable and cost effective. In some embodiments, the entire lamp can comprise five components that can be quickly and easily assembled.

Figure 22:
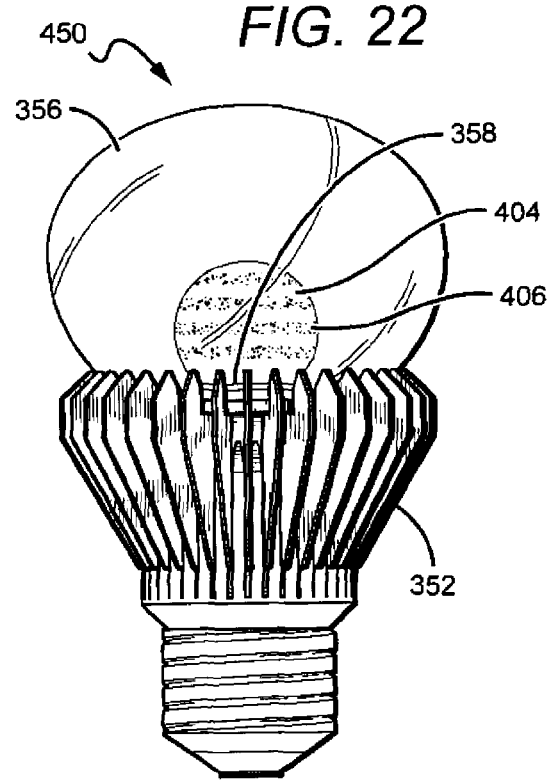
FIG. 22 is an elevation view of still another embodiment of a lamp according to the present invention.

As discussed above and shown in FIG. 16, different regions of a phosphor carrier can have different types of phosphors. In some embodiments, these different regions can provide for phosphor carriers that appear patterned. FIGS. 21 and 22 show additional lamp embodiments 400, 450 that are similar to the lamp 350 shown in FIGS. 19 and 20. The lamps also comprise a submount or heat sink 352, dome shaped diffuser 356, LEDs 358 that can be mounted on a planar surface of the heat sink 352 with the diffuser 356 over the LED chips 358. In FIG. 21 a phosphor carrier 402 is included between the LED 358 and diffuser 356, and in FIG. 22 a phosphor carrier 452 is included between the LEDs 358 and the diffuser 356. The LED chips 358 and phosphor carriers 402, 452 can comprise any of the arrangements and characteristics described above. It these embodiments, however, the phosphor carriers 402, 452 each comprise different first and second phosphors 404, 406, with the first and second phosphors in different regions. For phosphor carrier 402, the first phosphor 404 covers most of the phosphor carrier area, while the second phosphor is arranged as dots on others of the phosphor carrier areas. The overall phosphor carrier 404 appears to be patterned with dots. In other embodiments the first phosphor can cover all of the phosphor carrier and second phosphor can comprise dots on the first phosphor.

For phosphor carrier 452 in FIG. 22, the first phosphor 404 can cover most of the phosphor carrier while the second phosphor 406 can comprise stripes covering other portions of the phosphor carrier. In still other embodiments the first phosphor 404 can cover all of the phosphor carrier, and the second phosphor 406 can cover the first phosphor in a stripe pattern.

These are only some of the many different patterns that can be included on phosphor carriers according to the present invention. It is also understood that the phosphor carriers according to the present invention can comprise a transparent carrier material in a three-dimensional (e.g dome) or planar shape, with the phosphors described above being on the outside surface or inside surface of the transparent carrier, or on both surfaces. The portions of the patents described above can also be on different spaced apart phosphor carriers. For example, the dot arrangement of one phosphor can be on a first phosphor carrier that is spaced apart from the a second phosphor carrier with the other phosphor. The different phosphor carriers can be planar or three-dimensional.

Figure 23:
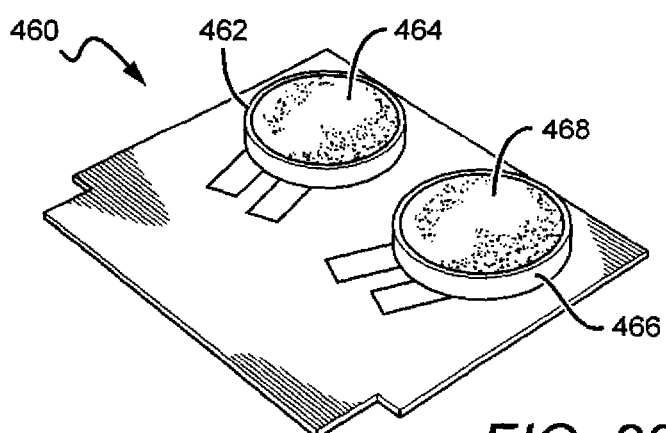
FIG. 23 is a perspective view of another embodiment of a lamp according to the present invention.

FIG. 23 shows still another embodiment of a lamp 460 according to the present invention comprising a first emitter package 462 with a green phosphor 464, and a second emitter package 466 with a red phosphor 468. The emission from the packages 464, 466 is directional such that nearly all of the light from the each of the emitters does not fall on the other. As a result, the light from the green phosphor 414 will not pass into the red phosphor 468 where it risks being re-absorbed. This type of lateral separation provides and even greater reduction in the amount of light that can be re-absorbed, and thereby further reduces the negative impact that re-absorption can have on a lamps CRI.

Figure 24:
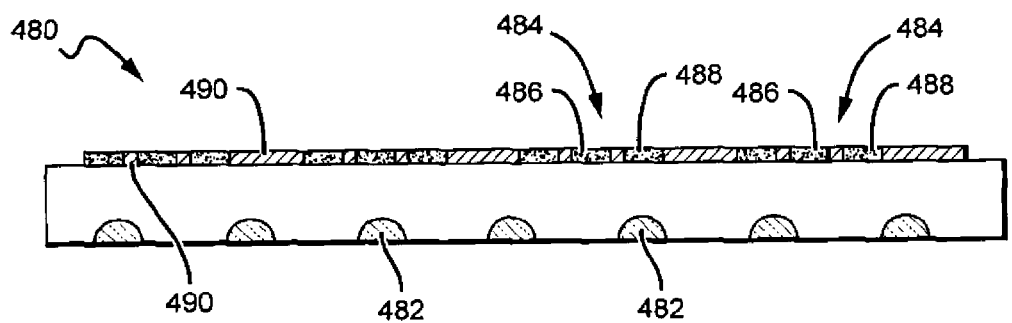
FIG. 24 is a sectional view of one embodiment of a lamp or display according to the present invention.

FIG. 24 shows still another lamp or display 480 according to the present invention having a plurality of blue LED chips 482 with spaced from a layer comprising a plurality of transmissive lamp/luminaire pixels 484. Each pixel 484 can comprise red or green quantum dots or phosphors 486, 488 that absorb blue light from the LED chips 482 and emit red and green light, respectively. A diffusing or reflective material 490 can be arranged between the red and green phosphors 486, 488 and between adjacent pixels 484 to reduce interaction or cross-talk between adjacent converter materials. Separation is provided between the red and green phosphors and efficiency improvements can be achieved by including the diffuser or reflective material 490 between the phosphors. The diffuser or reflective material can be optically opaque or translusive and helps prevent light from phosphor being reabsorbed by another.

Some of the above embodiments are described with reference to a first conformal phosphor coating with a second phosphor spaced apart from the first, such as in the shape of a dome. It is understood, that the second phosphor can be provided in many different shapes beyond a dome, and more than one phosphor can be provided in a dome. For example, the first phosphor can be provided in a dome over one or more of the LEDs, with the second phosphor provided as a dome over the first dome. It is also understood that more than two phosphors can be utilized in different conformal coatings or separated in different dome arrangements. It is also understood that one or more of the phosphors can comprise a disk that can be used in combination with other phosphor disks, or can be used in combination with phosphor globes or domes. The separation can also comprise in plane pixilation, such as in plane separation of LEDs coated with different materials such as yellow and red phosphors. There can also be many variations to the in plane package separation as described above.

Although the present invention has been described in detail with reference to certain preferred configurations thereof, other versions are possible. Therefore, the spirit and scope of the invention should not be limited to the versions described above.

We claim:

1. A solid state lamp, comprising:
a light emitting diode (LED) on a surface;
a first conversion material with light from said LED passing through said first conversion material, wherein said first conversion material converts and re-emits at least some of said LED light;
a second conversion material on said surface and spaced from said first conversion material by an optical cavity, with light from said LED passing through said second conversion material, wherein said second conversion material converts and re-emits at least some of said LED light;
wherein said first conversion material comprises an excitation spectrum that overlaps with the emission spectrum of said second conversion material.

2. The lamp of claim 1, wherein said first conversion material comprises an emission spectrum that does not overlap with the excitation spectrum of said second conversion material.

3. The lamp of claim 1, wherein said second conversion material is over said first conversion material.

4. The lamp of claim 1, wherein said second conversion material comprises a dome over said first conversion material.

5. The lamp of claim 1, wherein said first conversion material absorbs light from said LED and re-emits red light.

6. The lamp of claim 1, wherein said second conversion material absorbs light from said LED and re-emits yellow or green light.

7. The lamp of claim 1, wherein less than 25% of the light re-emitted from said second conversion material passes into said first conversion material.

8. The lamp of claim 1, emitting a white light combination or light from at least two of the sources comprising said LED, said first conversion material and said second conversion material.

9. The lamp of claim 1, wherein said second conversion material is in a globe over said light emitting diode.

10. The lamp of claim 9, further comprising a diffuser over said globe.

11. The lamp of claim 1, wherein said lamp emits light comprising an emission pattern that is compliant with Energy Star standards.

12. The lamp of claim 1, sized to fit an A19 size profile.

13. The lamp of claim 1, wherein said second conversion material is planar.

14. The lamp of claim 1, further comprising a planar diffuser.

15. A solid state lamp, comprising:
a plurality of light emitting diodes (LEDs);
a first red phosphor and a second red phosphor different than said first red phosphor, at least one of said first and second red phosphors on a first of said LEDs, with light from said first LED passing through said at least one red phosphor; and
a yellow or green phosphor separated from and over said LEDs, light from said LEDs passing through said yellow or green phosphor, wherein said first and second red phosphors comprise excitation spectrums that overlap with the emission spectrum of said yellow or green phosphor.

16. The lamp of claim 15, wherein said at least one of said plurality of LEDs emits blue light.

17. The lamp of claim 15, wherein at least one of said plurality of LEDs is uncoated by red phosphor.

18. The lamp of claim 17, wherein said at least one uncoated LED emits blue light.

19. The lamp of claim 15, wherein said first and second red phosphors comprise conformal coats over said first and second LEDs, respectively.

20. The lamp of claim 15, wherein said yellow or green phosphor is over said first and second red phosphors.

21. The lamp of claim 15, wherein less than 10% of the light re-emitted from said yellow or green phosphor passes into said first and second red phosphors.

22. A solid state lamp, comprising:
a light emitting diode (LED) emitting a first wavelength of light;
a conformal coating comprising a first phosphor on said LED, said coating absorbing some of the light emitted from said LED and re-emitting a second wavelength of light; and
a second phosphor spaced from said first phosphor by an optical cavity, with light from said LED passing through said second phosphor, said second phosphor absorbing at least some of said first wavelength of light and re-emitting a third wavelength of light, wherein the emission spectrum of said second phosphor overlaps the excitation spectrum of said first phosphor, and wherein the majority of light from said second phosphor does not encounter said first phosphor.

23. The lamp of claim 22, wherein said second phosphor is over said first phosphor.

24. The lamp of claim 22, wherein said second phosphor comprises a dome over said first phosphor.

25. The lamp of claim 22, wherein the emission spectrum of said first phosphor does not overlap the excitation spectrum of said second phosphor.

26. The lamp of claim 22, wherein the LED emits blue light.

27. The lamp of claim 22, wherein said first phosphor absorbs light from said LED and re-emits red light.

28. The lamp of claim 22, wherein said second phosphor absorbs light from said LED and re-emits yellow or green light.

29. The lamp of claim 22, wherein said first phosphor comprises a red phosphor and said second phosphor comprise a yellow or green phosphor, said red phosphor comprising an excitation spectrum that at least partially overlaps with the emission spectrum of said yellow or green phosphor.

30. The lamp of claim 22, wherein less than 10% of the light re-emitted from said second phosphor passes into said first phosphor.

31. The lamp of claim 1, wherein said first and second conversion materials are configured to minimize absorption of light passing through said first conversion material that has been re-emitted by said second conversion material.

32. The lamp of claim 1, wherein said surface is a substantially flat surface.

33. The lamp of claim 32, wherein said second conversion material is dome-shaped.

34. The lamp of claim 33, wherein the bottom of said dome-shaped second conversion material is substantially coplanar with said LED.

35. The lamp of claim 1, wherein said second conversion material is globe-shaped; and
wherein the bottom of said globe-shaped conversion material is substantially coplanar with or below said surface.

36. The lamp of claim 35, wherein the bottom of said globe-shaped conversion material is below said substantially flat surface.

37. The lamp of claim 1, wherein said first conversion material is conformally coated on said LED.

38. The lamp of claim 15, wherein said first and second red phosphors and said yellow or green phosphor are configured to minimize absorption of light passing through said first and second red phosphors that has been re-emitted by said yellow or green phosphor and to minimize absorption of light passing through said yellow or green phosphor that has been re-emitted by said first and second red phosphors.

39. The lamp of claim 15, wherein said first and second red phosphors are on different ones of said plurality of LEDs.

40. The lamp of claim 39, wherein said different ones of said plurality of LEDs emit the same wavelength of light.

41. The lamp of claim 40, wherein said first and second red phosphors re-emit different wavelengths of light.

42. The lamp of claim 15, wherein said first and second red phosphors re-emit different wavelengths of light.

43. The lamp of claim 15, wherein said first and second red phosphors are on said first LED.

44. The lamp of claim 43, wherein said first and second red phosphors re-emit different wavelengths of light.

45. The lamp of claim 15, wherein said yellow or green phosphor comprises a yellow phosphor and a green phosphor, wherein each of said yellow phosphor and said green phosphor are over and separated from each of said first and second red phosphors, and wherein said first and second red phosphors each comprise an excitation spectrum that overlaps with the emission spectrum of said yellow phosphor and the emission spectrum of said green phosphor.

46. The lamp of claim 15, wherein two or more of said plurality of LEDs are uncoated by both said first and second red phosphors.

47. The lamp of claim 22, wherein said first and second phosphors are configured to minimize absorption of light passing through said first phosphor that has been re-emitted by said second phosphor and to minimize absorption of light passing through said second phosphor that has been re-emitted by said first phosphor.

48. The lamp of claim 22, further comprising a third phosphor spaced from said first phosphor with light from said LED passing through said third phosphor, said third phosphor absorbing at least some of said first wavelength of light and re-emitting a fourth wavelength of light.

49. The lamp of claim 48, wherein the emission spectrum of said third phosphor overlaps the excitation spectrum of said first phosphor, and wherein the majority of light from said third phosphor does not encounter said first phosphor.

50. The lamp of claim 49, wherein the emission spectrum of said first phosphor does not overlap with the excitation spectrum of said second phosphor or the excitation spectrum of said third phosphor.

51. The lamp of claim 50, wherein said second phosphor is a yellow phosphor and said third phosphor is a green phosphor.

52. The lamp of claim 48, wherein one layer comprises said second phosphor and another layer comprises said third phosphor.

* * * * *